(12) United States Patent
Kim et al.

(10) Patent No.: US 10,827,605 B2
(45) Date of Patent: Nov. 3, 2020

(54) SUBSTRATE COMPRISING PLURALITY OF SIGNAL LINES AND ELECTRONIC DEVICE COMPRISING SAME

(71) Applicant: Samsung Electronics Co., Ltd., Suwon-si, Gyeonggi-do (KR)

(72) Inventors: Man-Ho Kim, Suwon-si (KR); Jong-Wan Shim, Yongin-si (KR); Hwa Joong Jung, Osan-si (KR); Tae-Yun Kim, Suwon-si (KR); Yonghwan Choi, Suwon-si (KR); Kihuk Lee, Suwon-si (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 0 days.

(21) Appl. No.: 16/491,350

(22) PCT Filed: Feb. 13, 2018

(86) PCT No.: PCT/KR2018/001878
§ 371 (c)(1),
(2) Date: Sep. 5, 2019

(87) PCT Pub. No.: WO2018/164387
PCT Pub. Date: Sep. 13, 2018

(65) Prior Publication Data
US 2020/0037439 A1 Jan. 30, 2020

(30) Foreign Application Priority Data
Mar. 6, 2017 (KR) .................. 10-2017-0028417

(51) Int. Cl.
*H05K 1/11* (2006.01)
*H05K 1/02* (2006.01)

(52) U.S. Cl.
CPC .......... *H05K 1/0245* (2013.01); *H05K 1/024* (2013.01); *H05K 1/115* (2013.01); *H05K 2201/05* (2013.01)

(58) Field of Classification Search
CPC .......... H05K 1/11; H05K 1/111; H05K 1/112; H05K 1/113; H05K 1/114; H05K 1/115; H05K 1/116; H05K 1/024; H05K 1/0245
See application file for complete search history.

(56) References Cited

U.S. PATENT DOCUMENTS

2003/0048256 A1* 3/2003 Salmon ............... G06F 1/1613
345/168
2007/0130555 A1* 6/2007 Osaka ............... H01L 23/49838
439/14
(Continued)

FOREIGN PATENT DOCUMENTS

JP 2001-015925 A 1/2001
JP 2009-010328 A 1/2009
(Continued)

OTHER PUBLICATIONS

"Requirements for Module Design" D-PHY Ver. 1.2 and C-PHY 1.0. MIPI Alliance "Specification Road Map", Mar. 2016.

*Primary Examiner* — Jeremy C Norris
(74) *Attorney, Agent, or Firm* — Jefferson IP Law, LLP

(57) ABSTRACT

The present disclosure relates to a 5th generation (5G) or pre-5G communication system for supporting a higher data transmission rate than 4th generation (4G) communication systems such as long term evolution (LTE). In a wireless communication system, a transmission apparatus comprises at least one antenna port for transmitting/receiving a signal, an analogue filter for selecting the frequency of the signal, and a voltage standing wave ratio (VSWR) detection unit for measuring the VSWR of the antenna port, wherein the VSWR detection unit is configured to detect both a forward
(Continued)

signal and a reverse signal for an input terminal of the analogue filter, to determine the respective power values of a forward signal and a reverse signal for an output terminal of the analogue filter by applying characteristic parameters of the analogue filter to the detected forward signal and reverse signal, and to determine the VSWR of the antenna port on the basis of the respective power values of the forward signal and the reverse signal for the output terminal of the analogue filter.

20 Claims, 20 Drawing Sheets

(56) References Cited

U.S. PATENT DOCUMENTS

| | | |
|---|---|---|
| 2008/0266019 A1 | 10/2008 | Fusayasu et al. |
| 2010/0051334 A1 | 3/2010 | Ho et al. |
| 2012/0152603 A1 | 6/2012 | Song et al. |

FOREIGN PATENT DOCUMENTS

| | | |
|---|---|---|
| JP | 2010-062325 A | 3/2010 |
| KR | 10-2009-0100916 A | 9/2009 |
| KR | 20-2009-0011593 U | 11/2009 |
| KR | 10-2012-0067057 A | 6/2012 |

* cited by examiner

Signal Voltage and Differential Voltage for the Six C-PHY Wire States

| Wire State | Wire Amplitude | | | Receiver diff input voltage | | | Receiver digital output | | |
|---|---|---|---|---|---|---|---|---|---|
| | A | B | C | A-B | B-C | C-A | Rx_AB | Rx_BC | Rx_CA |
| +x | ¾ V | ¼ V | ½ V | +½ V | -¼ V | -¼ V | 1 | 0 | 0 |
| -x | ¼ V | ¾ V | ½ V | -½ V | +¼ V | +¼ V | 0 | 1 | 1 |
| +y | ½ V | ¾ V | ¼ V | -¼ V | +½ V | -¼ V | 0 | 1 | 0 |
| -y | ½ V | ¼ V | ¾ V | +¼ V | -½ V | +¼ V | 1 | 0 | 1 |
| +z | ¼ V | ½ V | ¾ V | -¼ V | -¼ V | +½ V | 0 | 0 | 1 |
| -z | ¾ V | ½ V | ¼ V | +¼ V | +¼ V | -½ V | 1 | 1 | 0 |

FIG. 5C

Definition of Wire States

| Wire State Name | High-Speed State Code Name | Line Signal Levels | | |
|---|---|---|---|---|
| | | A | B | C |
| +x | HS_+X | High | Low | Middle |
| -x | HS_-X | Low | High | Middle |
| +y | HS_+Y | Middle | High | Low |
| -y | HS_-Y | Middle | Low | High |
| +z | HS_+Z | Low | Middle | High |
| -z | HS_-Z | High | Middle | Low |

FIG. 5D $\varepsilon_r$ : DIELECTRIC CONSTANT $$Z_d = \frac{174}{\sqrt{\varepsilon_r + 1.41}} \ln\left(\frac{5.98h}{(0.8w+t)}\right)\left(1 - 0.48 \exp\left(-0.96 \frac{d}{h}\right)\right)$$

$\varepsilon_r$ : DIELECTRIC CONSTANT $$Z_{Oe} = \eta_0 \frac{b-s}{2W\sqrt{\varepsilon_r}}$$

$\varepsilon_r$ : DIELECTRIC CONSTANT $$Z_{Oo} = \eta_0 \frac{1}{2W\sqrt{\varepsilon_r}[1/(b-S)+1/S]}$$

➡ $Z_0\_diff = 2*Z_{e\_}odd$ $\eta_0$ : the characteristic impedance of free space, which is equal to $120\pi$

SUBSTRATE COMPRISING PLURALITY OF SIGNAL LINES AND ELECTRONIC DEVICE COMPRISING SAME

TECHNICAL FIELD

Various embodiments of the present invention relate to a substrate including a plurality of signal lines and an electronic device including the same.

BACKGROUND ART

An electronic device is provided in various forms such as a smart phone, a tablet personal computer (PC), a personal digital assistant (PDA) with development of digital technology. The electronic device is also developed in a form wearable on a user so as to improve portability and user's accessibility.

The electronic device may include a printed circuit board (PCB) which sets an execution environment of the electronic device, maintains its information, and supports data input/output and exchange of components. The PCB may include signal lines for transmitting or receiving data between electronic parts. An electric field may be generated due to current flow at the signal line through which the data is transmitted, and such an electric field may cause an electro magnetic interference (EMI) phenomenon by loading noise in a signal transmitted on other adjacent signal line. The EMI between the signals is a factor which interferes with normal operations of the parts, and, to address this, a circuit for a transmitting side to transmit differential signals of data to transmit side to a receiving side via a pair of signal lines and for the receiving side to detect the EMI (e.g., noise) from the differential signals is used.

DISCLOSURE OF INVENTION

Technical Problem

A differential signal related technique for transmitting data more rapidly is demanded while parts of an electronic device which responds at a high speed are developed and multimedia technology advances.

One embodiment of the present invention may provide a circuit board or substrate including three signal lines for transmitting differential signals and an electronic device including the same.

One embodiment of the present invention may provide a circuit board or substrate for reducing electromagnetic interference between three signal lines for transmitting differential signals and obtaining signal integrity and an electronic device including the same.

Solution to Problem

According to one embodiment of the present invention, an electronic device may include a processor including a first terminal, a second terminal and a third terminal and a substrate, the substrate may include a first layer including a first signal line connected to the first terminal, a second signal line connected to the second terminal and a first dielectric having a first dielectric constant between the first signal line and the second signal line, the first layer disposed to form impedance corresponding to a designated frequency between the first signal line and the second signal line, a dielectric layer disposed under or beneath the first layer, and including at least part of a second dielectric having a second dielectric constant, and a second layer disposed under or beneath the dielectric layer, the second layer may include a third signal line disposed in an area facing the first dielectric and connected to the third terminal, and the third signal line may be disposed to form impedance having substantially the same magnitude as a magnitude of the impedance corresponding to the designated frequency between the third signal line and the first signal line and between the third signal line and the second signal line.

Advantageous Effects of Invention

According to one embodiment of the present invention, since a transmitting side transmits differential signals of data to transmit to a receiving side through three signal lines installed on a circuit board or substrate and the receiving side obtains the data by processing (e.g., processing the differential signals or calculating the differential signals) transmitted through the three signal lines (e.g., a first signal line, a second signal line and a third signal line), a data transmission/reception rate between the transmitting side and the receiving side may be improved. According to various embodiments of the present invention, since impedance formed between the first signal line and the second signal line, impedance formed between the first signal line and the third signal line, and impedance formed between the second signal line and the third signal line are designed substantially the same, electro magnetic interference between the signal lines may be improved and signal integrity may be also acquired. According to various embodiments of the present invention, since the three signal lines provided to transmit the differential signals are arranged, when viewed from a cross section of the substrate, substantially in a triangle shape in which other two signal lines are symmetrically disposed on both sides of one signal lines, a wiring space of the signal lines of the board or substrate and/or a size of the substrate may be reduced.

BRIEF DESCRIPTION OF DRAWINGS

FIGS. 5A, 5B, 5C, 5D, 5E and 5F are illustrations for explaining an operation of processing differential signals transmitted via three signal lines according to various embodiments of the present invention.

BEST MODE FOR CARRYING OUT THE INVENTION

Figure 1:
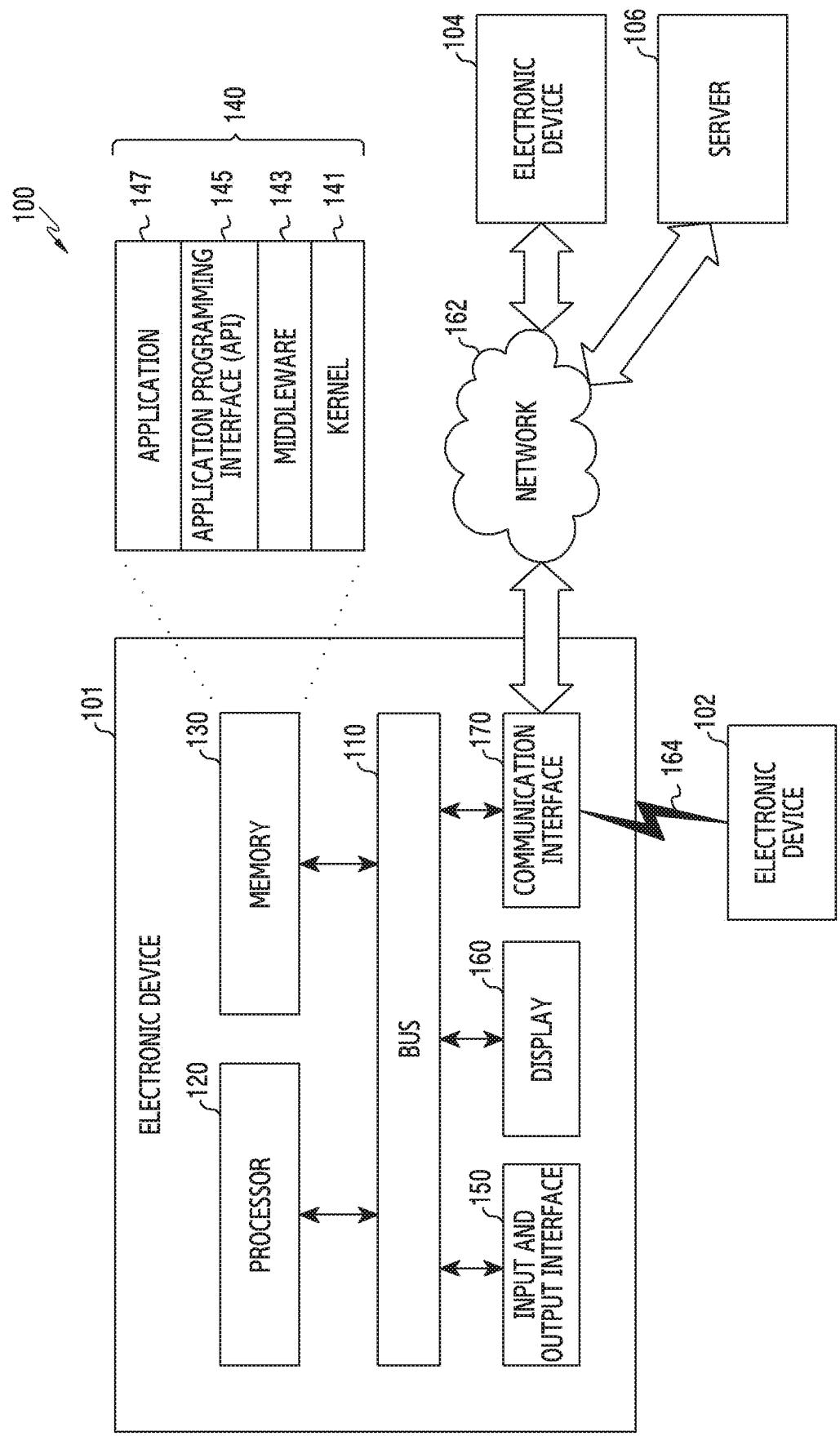
FIG. 1 is a block diagram of a network environment system according to one embodiment.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements. Singular forms may include plural forms as well unless the context clearly indicates otherwise. In the present disclosure, the expression "A or B" or "at least one of A or/and B" may include all possible combinations of the items listed. The expression "a first", "a second", "the first", or "the second" used in various embodiments of the present disclosure may modify various components regardless of the order and/or the importance but does not limit the corresponding components. When an element (e.g., first element) is referred to as being (operatively or communicatively) "connected," or "coupled," to another element (e.g., second element), it may be directly connected or coupled directly to the other element or any other element (e.g., third element) may be interposer between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

An electronic device (e.g. a first electronic device (401) or a second electronic device (402) of FIG. 4) according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame. According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology. Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to various embodiments of the present disclosure. An electronic device 101 within a network environment 100, according to various embodiments, will be described with reference to FIG. 1. The electronic device 101 may include a bus 110, a processor 120, a memory 130, an input/output interface 150, a display 160, and a communication interface 170. In some embodiments, the electronic device 101 may omit at least one of the above elements or may further include other elements. The bus 110 may include, for example, a circuit for connecting the elements 110-170 and transferring communication (e.g., control messages and/or data) between the elements. The processor 120 may include one or more of a Central Processing Unit (CPU), an Application Processor (AP), and a Communication Processor (CP). The processor 120, for example, may carry out operations or data processing relating to control and/or communication of at least one other element of the electronic device 101.

According to one embodiment, the bus 110 may include a first signal line, a second signal line and a third signal line which are not shown, for transmitting differential signals of data to transmit from a transmitting side to a receiving side. The first signal line, the second signal line and the third signal line may be included in at least one substrate of the electronic device 101.

According to one embodiment, a first impedance value formed between the first signal line and the second signal line, a second impedance value formed between the first signal line and the third signal line, and a third impedance value formed between the second signal line and the third signal line may be designed substantially the same as an impedance value corresponding to a designated frequency. If the first impedance value, the second impedance value and the third impedance value are designed substantially the same, signal integrity may be obtained in transmitting the differential signals of the data to transmit from the transmitting side to the receiving side via a plurality of signal lines of the first signal line, the second signal line and the third signal line.

According to one embodiment, the three signal lines provided to transmit the differential signals of the data to transmit from the transmitting side to the receiving side may be arranged, when viewed from a cross section of the substrate, substantially in a triangular shape where the first and second signal lines are disposed symmetrically on both sides of the third signal line.

According to one embodiment, in a first transmission/reception mode, if data is transmitted from the transmitting side to the receiving side, the transmitting side or the receiving side may select two signal lines from the first signal line, the second signal line and the third signal lines of the bus 110, and the transmitting side may generate and transmit a first differential signal and a second differential signal of the data to transmit to the receiving side via the two selected signal lines. According to one embodiment, the first differential signal and the second differential signal may be in a complementary relation. For example, the first differential signal and the second differential signal may have opposite phases. For example, the first differential signal and the second differential signal may have different levels (or voltages) (e.g., a high level, a low level). According to one embodiment, the transmitting side may include the processor 120, and the receiving side may include the memory 130, the input/output interface 150, the display 160 or the communication interface 170. According to various embodiments, the transmitting side may include the memory 130, the input/output interface 150, the display 160 or the communication interface 170, and the receiving side may include the processor 120. According to one embodiment, in the first transmission/reception mode, the receiving side may compare the differential signals received from the transmitting side, and obtain (or extract) data based on its comparison value (e.g., process the differential signal or calculate the differential signals).

According to one embodiment, in a second transmission/reception mode, if data is transmitted from the transmitting side to the receiving side, the transmitting side or the receiving side may select all of the first signal line, the second signal line and the third signal line of the bus 110, and the transmitting side may generate and transmit to the receiving side via the three selected signal lines, a third differential signal, a fourth differential signal and a fifth differential signal of the data to transmit. According to one embodiment, the third differential signal, and the fourth differential signal and the fifth differential signal may have different levels (or voltages). For example, the third differential signal may be one of a high level, a middle level and a low level. The fourth differential signal may be one of the high level, the middle level and the low level, and may have a different level from the third differential signal. The fifth differential signal may be one of the high level, the middle level and the low level, and may have a different level from the third differential signal and the fourth differential signal. According to one embodiment, the transmitting side may include the processor 120, and the receiving side may include the memory 130, the input/output interface 150, the display 160 or the communication interface 170. According to various embodiments, the transmitting side may include the memory 130, the input/output interface 150, the display 160 or the communication interface 170, and the receiving side may include the processor 120. According to one embodiment, in the second transmission/reception mode, the receiving side may compare the differential signals transmitted from the transmitting side, and obtain (or extract) data based on its comparison value (e.g., process the differential signals or calculate the differential signals).

According to one embodiment, a first impedance value formed between the first signal line and the second signal line of the bus 110, a second impedance value formed between the first signal line and the third signal line, and a third impedance value formed between the second signal line and the third signal line may be designed substantially the same. If the first impedance value, the second impedance value and the third impedance value are designed the same, in the first transmission/reception mode or the second transmission/reception mode, the signal integrity may be obtained in the data transmission using the differential signals transmitted via a plurality of signal lines of the first signal line, the second signal line and the third signal line between the transmitting side and the receiving side.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS). The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data. In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program. The API 145 is an interface through which the applications 147 control functions provided from the kernel 141 or the middleware 143, and may include, for example, at least one interface or function (e.g., instruction) for file control, window control, image processing, or text control. The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160, for example, may display various types of content (e.g., text, images, videos, icons, or symbols) for the user. The display 160 may include a touch screen and receive, for example, a touch, gesture, proximity, or hovering input using an electronic pen or the user's body part. The communication interface 170, for example, may set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106).

The wireless communication may include, for example, Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), and Global System for Mobile Communications (GSM), as a cellular communication protocol. According to an embodiment, the wireless communication may include, for example, at least one of Wi-Fi, Bluetooth, Bluetooth low energy (BLE), Zigbee, Near Field Communication (NFC), magnetic secure transmission, radio frequency, or body area network (BAN). The GNSS may include at least one of, for example, a Global Positioning System (GPS), a Global Navigation Satellite System (Glonass), a Beidou Navigation Satellite System (hereinafter referred to as "Beidou"), and a European Global Satellite-based Navigation System (Galileo), according to a use area, a bandwidth, or the like. Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one of a communication network such as a computer network (e.g., a LAN or a WAN), the Internet, and a telephone network.

According to various embodiments, the wired communication (e.g., USB, HDMI, RS-232, power line communication, or POTS, etc.), if the electronic device 101 transmits data to the external device 102 and 104, the electronic device 101 may select a plurality of signal lines from the first signal line, the second signal line and the third signal line of the bus 110, and transmit differential signals of data to transmit to the external electronic device 102 and 104 via the plurality of the selected signal lines. According to various embodiments, in the wired communication, if the electronic device 101 receives data from the external device 102 and 104, the electronic device 101 may select a plurality of signal lines from the first signal line, the second signal line and the third signal line of the bus 110, and receive differential signals of data to receive from the external electronic device 102 and 104 via the plurality of the selected signal lines. According to one embodiment, a first impedance value formed between the first signal line and the second signal line of the bus 110, a second impedance value formed between the first signal line and the third signal line, and a third impedance value formed between the second signal line and the third signal line may be designed substantially the same. If the first impedance value, the second impedance value and the third impedance value are designed the same, the signal integrity may be obtained in the data transmission using the differential signals transmitted via a plurality of signal lines of the first signal line, the second signal line and the third signal line between the electronic device 101 and the external electronic device 102 and 104.

Each of the first and second external electronic apparatuses 102 and 104 may be of a type identical to or different from that of the electronic apparatus 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic apparatus may execute the requested functions or the additional functions, and may deliver a result of the execution to the electronic apparatus 101. The electronic device 101 may process the received result as it is or additionally to provide the requested functions or services. To achieve this, for example, cloud computing, distributed computing, or client-server computing technology may be used. The server 106, for example, includes at least one of a voice processing server, a voice recognition server, a voice service providing server, a data server, a searching server, a settlement server, a card company server, a bank server, an authentication server, an application server, a management server, an integration server, a provider server (or communication operator server), a content server, an internet server, or cloud server.

Figure 2:
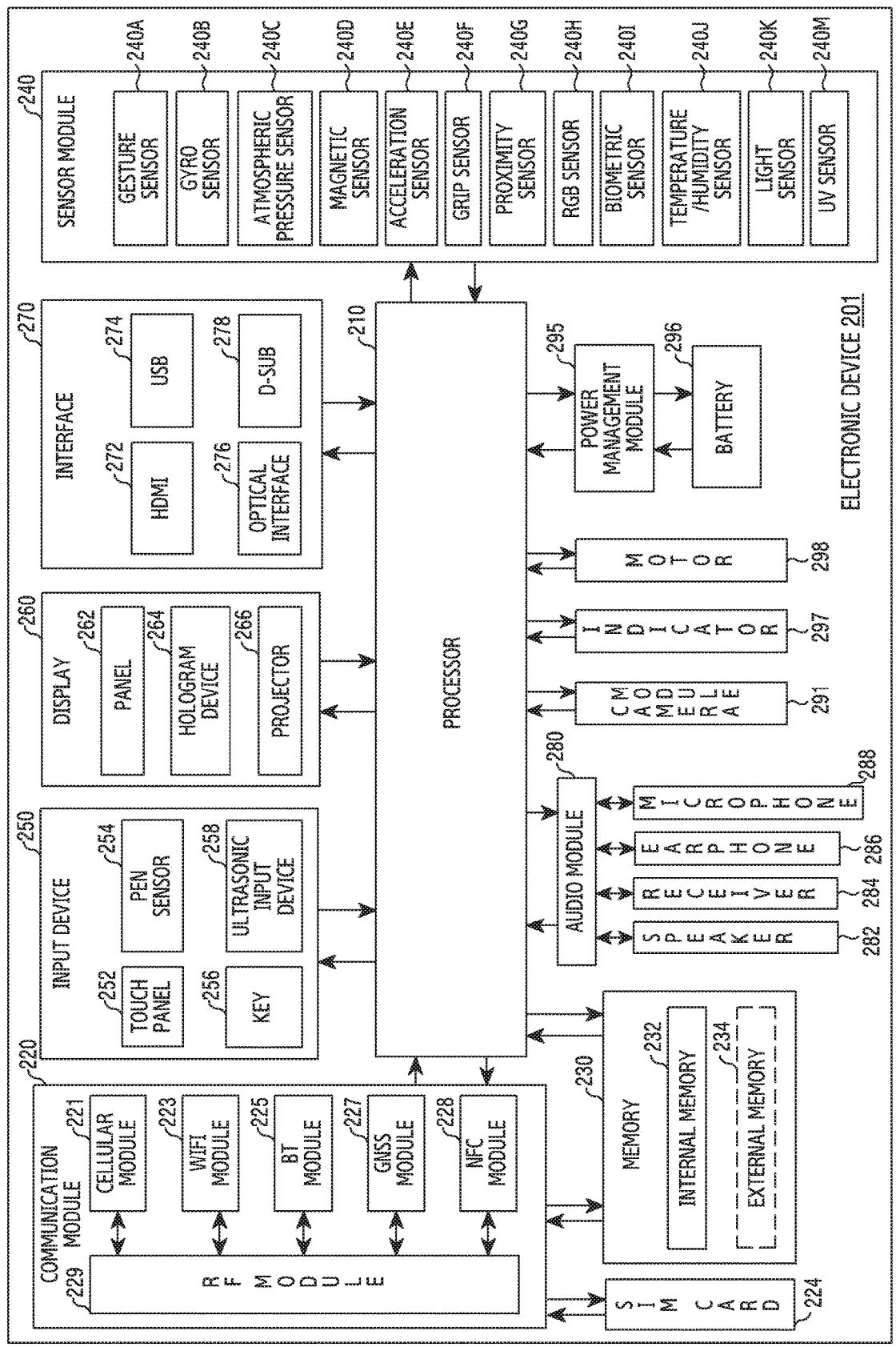
FIG. 2 is a block diagram of an electronic device according to various embodiments.

FIG. 2 is a block diagram illustrating an electronic device according to various embodiments of the present disclosure. FIG. 2 is a block diagram of an electronic device 201 according to various embodiments. For example, the electronic apparatus 201 may include the whole or part of the electronic apparatus 101 illustrated in FIG. 1. The electronic device 201 may include at least one processor (e.g., Application Processor (AP)) 210, a communication module 220, a Subscriber Identification Module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an operating system or an application program and perform processing of various pieces of data and calculations. The processor 210 may be implemented by, for example, a System on Chip (SoC). According to an embodiment, the processor 210 may further include a Graphic Processing Unit (GPU) and/or an image signal processor. The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory.

The communication module 220 may include, for example, the cellular module 221, a Wi-Fi module 223, a Bluetooth (BT) module 225, a GNSS module 227 (e.g., a GPS module, a Glonass module, a Beidou module, or a Galileo module), an NFC module 228, and a Radio Frequency (RF) module 229. The cellular module 221 may provide a voice call, image call, a text message service, or an Internet service through, for example, a communication network. According to an embodiment, the cellular module 221 may distinguish between and authenticate electronic devices 201 within a communication network using a subscriber identification module (for example, the SIM card 224). According to an embodiment of the present disclosure, the cellular module 221 may perform at least some of the functions that the processor 210 may provide. According to an embodiment, the cellular module 221 may include a Communication Processor (CP). According to some embodiments of the present disclosure, at least some (e.g., two or more) of the cellular module 221, the Wi-Fi module 223, the BT module 225, the GNSS module 227, and the NFC module 228 may be included in one Integrated Chip (IC) or IC package. The RF module 229 may transmit/receive, for example, a communication signal (for example, an RF signal). The RF module 229 may include, for example, a transceiver, a Power Amplifier Module (PAM), a frequency filter, a Low Noise Amplifier (LNA), and an antenna. According to another embodiment of the present disclosure, at least one of the cellular module 221, the Wi-Fi module 223, the BT module 225, the GNSS module 227, and the NFC module 228 may transmit and receive RF signals through a separate RF module. The subscriber identification module 224 may include, for example, a card including a subscriber identity module and/or an embedded SIM, and may contain unique identification information (e.g., an Integrated Circuit Card Identifier (ICCID)) or subscriber information (e.g., an International Mobile Subscriber Identity (IMSI)).

The memory 230 (for example, the memory 130) may include, for example, an internal memory 232 or an external memory 234. The embedded memory 232 may include at least one of a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (for example, a NAND flash memory or a NOR flash memory), a hard disc drive, a Solid State Drive (SSD), and the like). The external memory 234 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 234 may be functionally and/or physically connected to the electronic apparatus 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a Red/Green/Blue (RGB) sensor), a bio-sensor 240I, a temperature/humidity sensor 240J, a light sensor 240K, and an Ultra Violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic apparatus 201 may further include a processor configured to control the sensor module 240 as a part of or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user. The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram device 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram 264 may show a three dimensional image in the air by using an interference of light. The projector 266 may display an image by projecting light onto a screen. The screen may be located, for example, inside or outside the electronic apparatus 201. According to an embodiment, the display 260 may further include a control circuit for controlling the panel 262, the hologram device 264, or the projector 266. The interface 270 may include, for example, a High-Definition Multimedia Interface (HDMI) 272, a Universal Serial Bus (USB) 274, an optical interface 276, or a D-subminiature (D-sub) 278. The interface 270 may be included in, for example, the communication interface 170 illustrated in FIG. 1. Additionally or alternatively, the interface 270 may include, for example, a Mobile High-definition Link (MHL) interface, a Secure Digital (SD) card/Multi-Media Card (MMC) interface, or an Infrared Data Association (IrDA) standard interface.

The audio module 280 may bilaterally convert, for example, a sound and an electrical signal. At least some elements of the audio module 280 may be included in, for example, the input/output interface 145 illustrated in FIG. 1. The audio module 280 may process sound information which is input or output through, for example, a speaker 282, a receiver 284, earphones 286, the microphone 288 or the like. The camera module 291 is a device which may photograph a still image and a dynamic image. According to an embodiment, the camera module 291 may include one or more image sensors (for example, a front sensor or a back sensor), a lens, an Image Signal Processor (ISP) or a flash (for example, LED or xenon lamp). The power management module 295 may manage, for example, power of the electronic device 201. According to an embodiment, the power management module 295 may include a Power Management Integrated Circuit (PMIC), a charger Integrated Circuit (IC), or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

The indicator 297 may display a particular state (e.g., a booting state, a message state, a charging state, or the like) of the electronic apparatus 201 or a part (e.g., the processor 210). The motor 298 may convert an electrical signal into mechanical vibration, and may generate vibration, a haptic effect, or the like. Although not illustrated, the electronic apparatus 201 may include a processing unit (e.g., a GPU) for supporting a mobile television (TV). The processing unit for supporting mobile TV may, for example, process media data according to a certain standard such as Digital Multimedia Broadcasting (DMB), Digital Video Broadcasting (DVB), or mediaFLO™. Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

The electronic device 201 may include a first signal line, a second signal line and a third signal line which are not shown, for transmitting differential signals of data to transmit, if transmitting data from the transmitting side to the receiving side. The transmitting side of the electronic device 201 may select a plurality of signal lines from the first signal line, the second signal line and the third signal line, and transmit the differential signals of the data to transmit to the receiving side via the plurality of the selected signal lines. The receiving side of the electronic device 201 may obtain (or extract) the data by comparing the differential signals received via the plurality of the signal lines of the first signal line, the second signal line and the third signal lines. According to one embodiment, a first impedance value formed between the first signal line and the second signal line, a second impedance value formed between the first signal line and the third signal line, and a third impedance value formed between the second signal line and the third signal line may be designed substantially the same. If the first impedance value, the second impedance value and the third impedance value are designed the same, the signal integrity may be obtained in transmitting the differential signals from the transmitting side to the receiving side via the plurality of signal lines selected from the first signal line, the second signal line and the third signal line.

According to one embodiment, the first signal line, the second signal line and the third signal line may be arranged, when viewed from the cross section of the substrate, substantially in a triangular shape where the first and second signal lines are disposed symmetrically on both sides of the third signal line.

According to one embodiment, in the first transmission/reception mode, the electronic device 201 may select two signal lines from the first signal line, the second signal line and the third signal line, and generate and transmit the first differential signal and the second differential signal of data to transmit from the transmitting side to the receiving side through the two selected signal lines. According to one embodiment, in the first transmission/reception mode, the receiving side of the electronic device 201 may obtain (or extract) the data by comparing the first differential signal and the second differential signal obtained via the two signal lines (e.g., process the differential signals or calculate differential signals).

According to one embodiment, in the second transmission mode, the electronic device 201 may select all of the first signal line, the second signal line and the third signal line, and generate and transmit a third differential signal, a fourth differential signal and a fifth differential signal of data to transmit from the transmitting side to the receiving side via the three selected signal lines. In the second transmission/reception mode, the receiving side of the electronic device 201 may obtain (or extract) the data by comparing the third differential signal, the fourth differential signal and the fifth differential signal obtained via the three signal lines (e.g., process the differential signals or calculate differential signals).

According to one embodiment, the electronic device 201 may include at least one printed circuit board (PCB) which not shown. The PCB may set an execution environment of the electronic device 201, maintain its information, and support data input/output and exchange of the components of the electronic device 201. According to one embodiment, PCB may include the first signal line, the second signal line and the third signal line for transmitting differential signals. The electronic device 201 may select a plurality of signal lines from the first signal line, the second signal line and the third signal line, generate differential signals of data to transmit, and transmit them from the transmitting side to the receiving side of the PCB via the selected signal lines. The receiving side of the PCB may obtain (or extract) the data by comparing the first differential signal and the second differential signal obtained via two signal lines. For example, in the second transmission/reception mode, the processor 210 may obtain differential signals of image data from the camera module 291 via the first signal line, the second signal line and the third signal line, and acquire the image data by comparing the difference signals.

According to various embodiments, the electronic device 201 may include a connecting circuit for electrically connecting the PCB with at least one component which is physically separated from the PCB. According to one embodiment, the connecting circuit may include the first signal line, the second signal line and the third signal line for transmitting differential signals in the first transmission/reception mode or the second transmission/reception mode. According to one embodiment, the first transmission/reception mode or the second transmission/reception mode, via a plurality of signal lines selected from the first signal line, the signal line and the third signal line, the differential signals of the data may be exchanged between at least one component mounted on the PCB and at least one component physically separated from the PCB. The at least one component mounted on the PCB and the at least one component physically separated from the PCB may obtain the data by comparing the differential signals transmitted via the plurality of the signal lines.

According to various embodiments, the electronic device 201 may include a first PCB (not shown) on which at least one first component is mounted and a second PCB (not shown) on which at least one second component is mounted. The electronic device 201 may include a connecting circuit for electrically connecting the first PCB and the second PCB. For example, the electronic device 201 may include a first connector formed on the first PCB, a second connector formed on the second PCB, a cable for electrically connecting the first connector and the second connector, and the connecting circuit such as a flexible PCB (FPCB). According to one embodiment, the connecting circuit may include the first signal line, the second signal line and the third signal line for transmitting differential signals in the first transmission/reception mode or the second transmission/reception mode. According to one embodiment, in the first transmission/reception mode or the second transmission/reception, differential signals of data may be exchanged between the at least one first component of the first PCB and the at least one second component of the second PCB via a plurality of signal lines selected from the first signal line, the second signal line and the third signal line. The at least one first component of the first PCB and the at least one second component of the second PCB may obtain the data by comparing the differential signals transmitted via the plurality of the signal lines. For example, in the first transmission/reception mode or the second transmission/reception mode, the processor 210 mounted on the first PCB may exchange differential signals with the display 260 mounted on the second PCB via a plurality of signal lines of the first signal line, the second signal line and the third signal line of the connecting circuit.

The term "module" used in the present disclosure includes a unit including hardware, software, or firmware, and, for example, may be interchangeably used with terms such as logic, logical block, component, or circuit. "module" may be an integral component or a minimum unit for performing one or more functions or its part. "module" may be mechanically or electrically implemented, and, for example, may include an application-specific integrated circuit (ASIC) chip, a field-programmable gate arrays (FPGAs), and a programmable-logic device, which are known or will be developed, for conducting certain operations. At least part of a device (e.g., modules or functions thereof) or a method (e.g., operations) according to various embodiments may be implemented with an instruction stored in a computer-readable storage medium (e.g., the memory 130) in the form of a program module. If the instruction is executed by a processor (e.g., the processor 120), the processor may perform a function corresponding to the instruction. The computer-readable recording medium may include a hard disk, a floppy disc, a magnetic medium (e.g., a magnetic tape), an optical storage medium (e.g., a compact disc-ROM (CD-ROM) or a DVD, a magnetic-optic medium (e.g., a floptical disc)), and an internal memory. The instruction may include code created by a compiler or code executable by an interpreter. The module or program module according to various embodiments may include at least one or more components of the aforementioned components, omit some of them, or further include additional other components. Operations performed by the module, the program, or another component according to various embodiments may be carried out sequentially, in parallel, repeatedly, or heuristically, or at least some operations may be executed in a different order or omitted, or other operations may be added.

Figure 3:
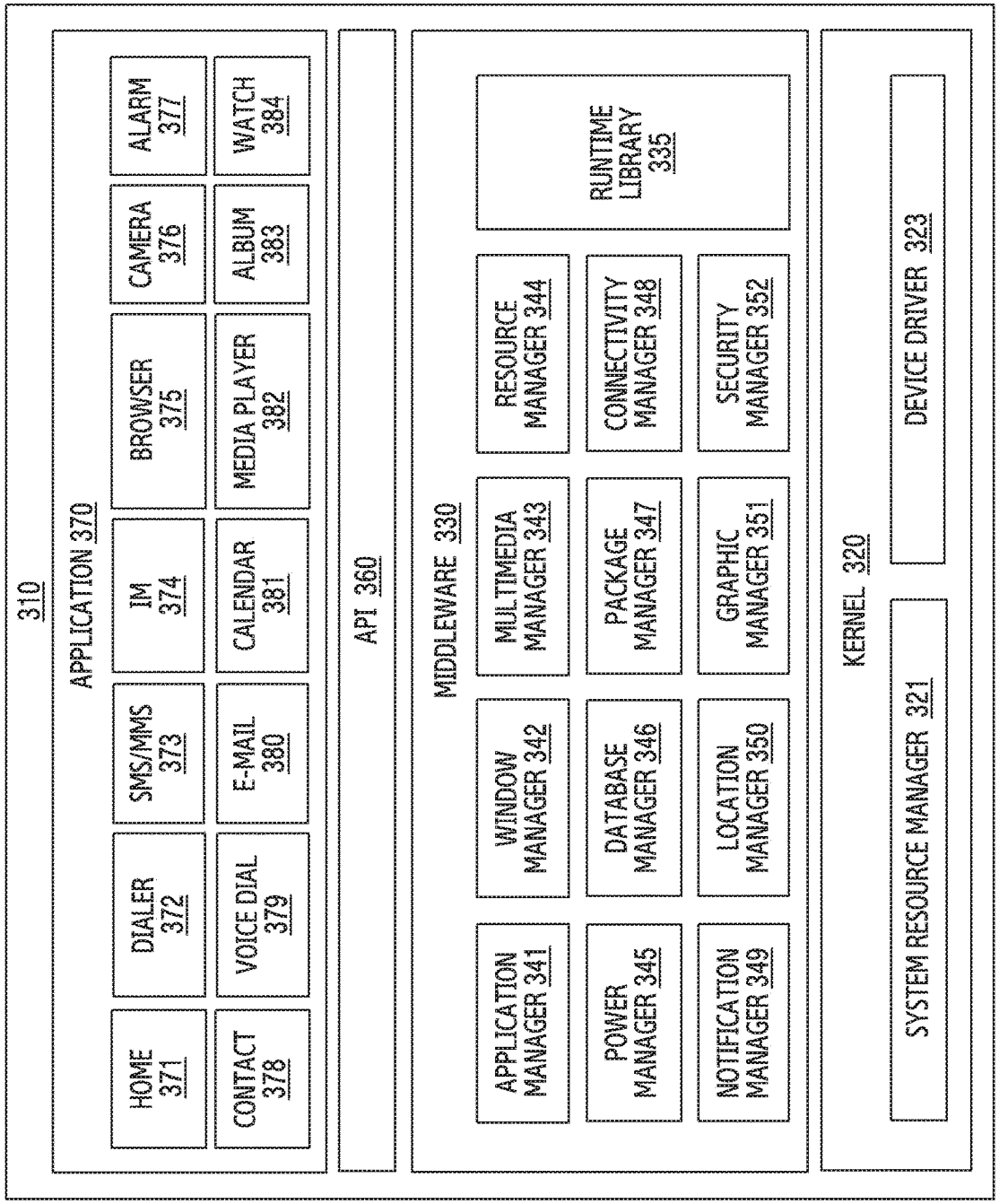
FIG. 3 is a block diagram of a program module according to various embodiments.

FIG. 3 is a block diagram of a program module according to various embodiments of the present disclosure. According to an embodiment, the program module 310 (for example, the program 140) may include an Operating System (OS) for controlling resources related to the electronic device (for example, the electronic device 101) and/or various applications (for example, the application programs 147) executed in the operating system. The operating system may be, for example, Android, iOS, Windows, Symbian, Tizen, Bada, or the like. The program module 310 may include a kernel 320, middleware 330, an API 360, and/or an application 370. At least some of the program module 310 may be preloaded on the electronic apparatus, or may be downloaded from an external electronic apparatus (e.g., the electronic apparatus 102 or 104, or the server 106).

The kernel 320 (e.g., the kernel 141) may include, for example, a system resource manager 321 and/or a device driver 323. The system resource manager 321 may perform the control, allocation, retrieval, or the like of system resources. According to an embodiment of the present disclosure, the system resource manager 321 may include a process manager, a memory manager, a file system manager, or the like. The device driver 323 may include, for example, a display driver, a camera driver, a Bluetooth driver, a shared memory driver, a USB driver, a keypad driver, a Wi-Fi driver, an audio driver, or an Inter-Process Communication (IPC) driver. The middleware 330 may provide a function required by the applications 370 in common or provide various functions to the applications 370 through the API 360 so that the applications 370 can efficiently use limited system resources within the electronic device. According to an embodiment, the middleware 330 (for example, the middleware 143) may include, for example, at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while the applications 370 are being executed. The runtime library 335 may perform input/output management, memory management, the functionality for an arithmetic function, or the like. The application manager 341 may manage, for example, the life cycle of at least one of the applications 370. The window manager 342 may manage Graphical User Interface (GUI) resources used for the screen. The multimedia manager 343 may determine a format required to reproduce various media files, and may encode or decode a media file by using a coder/decoder (codec) appropriate for the relevant format. The resource manager 344 may manage resources, such as a source code, a memory, a storage space, and the like of at least one of the applications 370. The power manager 345 may operate together with a Basic Input/Output System (BIOS) to manage a battery or power and may provide power information required for the operation of the electronic device. The database manager 346 may generate, search for, and/or change a database to be used by at least one of the applications 370. The package manager 347 may manage the installation or update of an application distributed in the form of a package file.

The connectivity manager 348 may manage a wireless connection such as, for example, Wi-Fi or Bluetooth. The notification manager 349 may display or notify of an event, such as an arrival message, an appointment, a proximity notification, and the like, in such a manner as not to disturb the user. The location manager 350 may manage location information of the electronic apparatus. The graphic manager 351 may manage a graphic effect, which is to be provided to the user, or a user interface related to the graphic effect. The security manager 352 may provide various security functions required for system security, user authentication, and the like. According to an embodiment of the present disclosure, when the electronic apparatus (e.g., the electronic apparatus 101) has a telephone call function, the middleware 330 may further include a telephony manager for managing a voice call function or a video call function of the electronic apparatus. The middleware 330 may include a middleware module that forms a combination of various functions of the above-described elements. The middleware 330 may provide a module specialized for each type of OS in order to provide a differentiated function. Also, the middleware 330 may dynamically delete some of the existing elements, or may add new elements. The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 may include, for example, one or more applications which can provide functions such as home 371, dialer 372, SMS/MMS 373, Instant Message (IM) 374, browser 375, camera 376, alarm 377, contacts 378, voice dialer 379, email 380, calendar 381, media player 382, album 383, clock 384, augmented reality (AR) application 385, health care (for example, measure exercise quantity or blood sugar), or environment information (for example, atmospheric pressure, humidity, or temperature information). According to an embodiment of the present disclosure, AR application 385 an application using a marker for AR function. According to an embodiment of the present disclosure, the applications 370 may include an application (hereinafter, referred to as an "information exchange application" for convenience of description) supporting information exchange between the electronic apparatus (e.g., the electronic apparatus 101) and an external electronic apparatus (e.g., the electronic apparatus 102 or 104). The application associated with information exchange may include, for example, a notification relay application for forwarding specific information to an external electronic device, or a device management application for managing an external electronic device. For example, the notification relay application may include a function of delivering, to the external electronic apparatus (e.g., the electronic apparatus 102 or 104), notification information generated by other applications (e.g., an SMS/MMS application, an email application, a health care application, an environmental information application, etc.) of the electronic apparatus 101. Further, the notification relay application may receive notification information from, for example, an external electronic device and provide the received notification information to a user. The device management application may manage (for example, install, delete, or update), for example, a function for at least a part of the external electronic device (for example, the electronic device 102 or 104) communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service). According to an embodiment, the applications 370 may include applications (for example, a health care application of a mobile medical appliance or the like) designated according to attributes of the external electronic device 102 or 104. According to an embodiment of the present disclosure, the application 370 may include an application received from the external electronic apparatus (e.g., the server 106, or the electronic apparatus 102 or 104). According to an embodiment of the present disclosure, the application 370 may include a preloaded application or a third party application which can be downloaded from the server. Names of the elements of the program module 310, according to the above-described embodiments of the present disclosure, may change depending on the type of OS. According to various embodiments of the present disclosure, at least some of the program module 310 may be implemented in software, firmware, hardware, or a combination of two or more thereof. At least some of the program module 310 may be implemented (e.g., executed) by, for example, the processor (e.g., the processor 210). At least some of the program module 310 may include, for example, a module, a program, a routine, a set of instructions, and/or a process for performing one or more functions.

The term "module" used in the present disclosure includes a unit including hardware, software, or firmware, and, for example, may be interchangeably used with terms such as logic, logical block, component, or circuit. "module" may be an integral component or a minimum unit for performing one or more functions or its part. "module" may be mechanically or electrically implemented, and, for example, may include an application-specific integrated circuit (ASIC) chip, a field-programmable gate arrays (FPGAs), and a programmable-logic device, which are known or will be developed, for conducting certain operations. At least part of a device (e.g., modules or functions thereof) or a method (e.g., operations) according to various embodiments may be implemented with an instruction stored in a computer-readable storage medium (e.g., the memory 130) in the form of a program module. If the instruction is executed by a processor (e.g., the processor 120), the processor may perform a function corresponding to the instruction. The computer-readable recording medium may include a hard disk, a floppy disc, a magnetic medium (e.g., a magnetic tape), an optical storage medium (e.g., a compact disc-ROM (CD-ROM) or a DVD, a magnetic-optic medium (e.g., a floptical disc)), and an internal memory. The instruction may include code created by a compiler or code executable by an interpreter. The module or program module according to various embodiments may include at least one or more components of the aforementioned components, omit some of them, or further include additional other components. Operations performed by the module, the program, or another component according to various embodiments may be carried out sequentially, in parallel, repeatedly, or heuristically, or at least some operations may be executed in a different order or omitted, or other operations may be added.

Figure 4A:
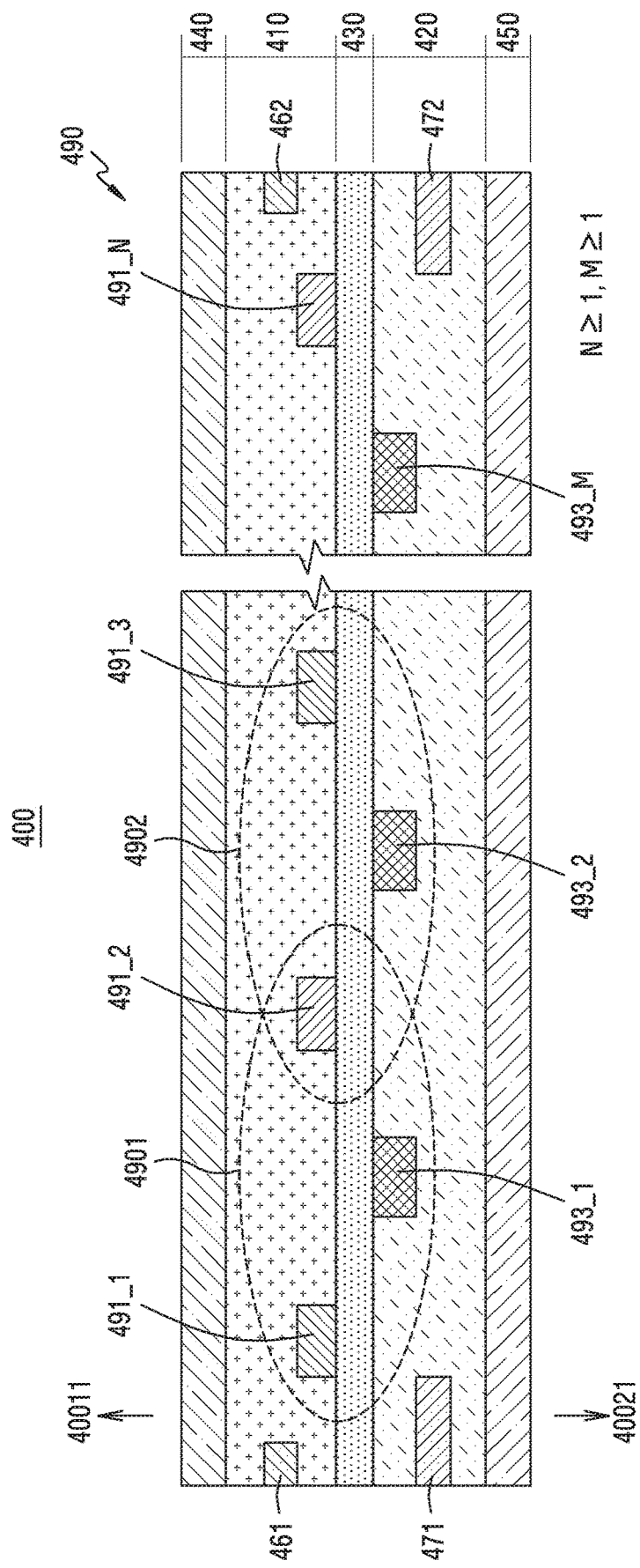
FIGS. 4A and 4B are cross-sectional views showing a structure of a substrate included in an electronic device according to one embodiment of the present invention.
Figure 4B:
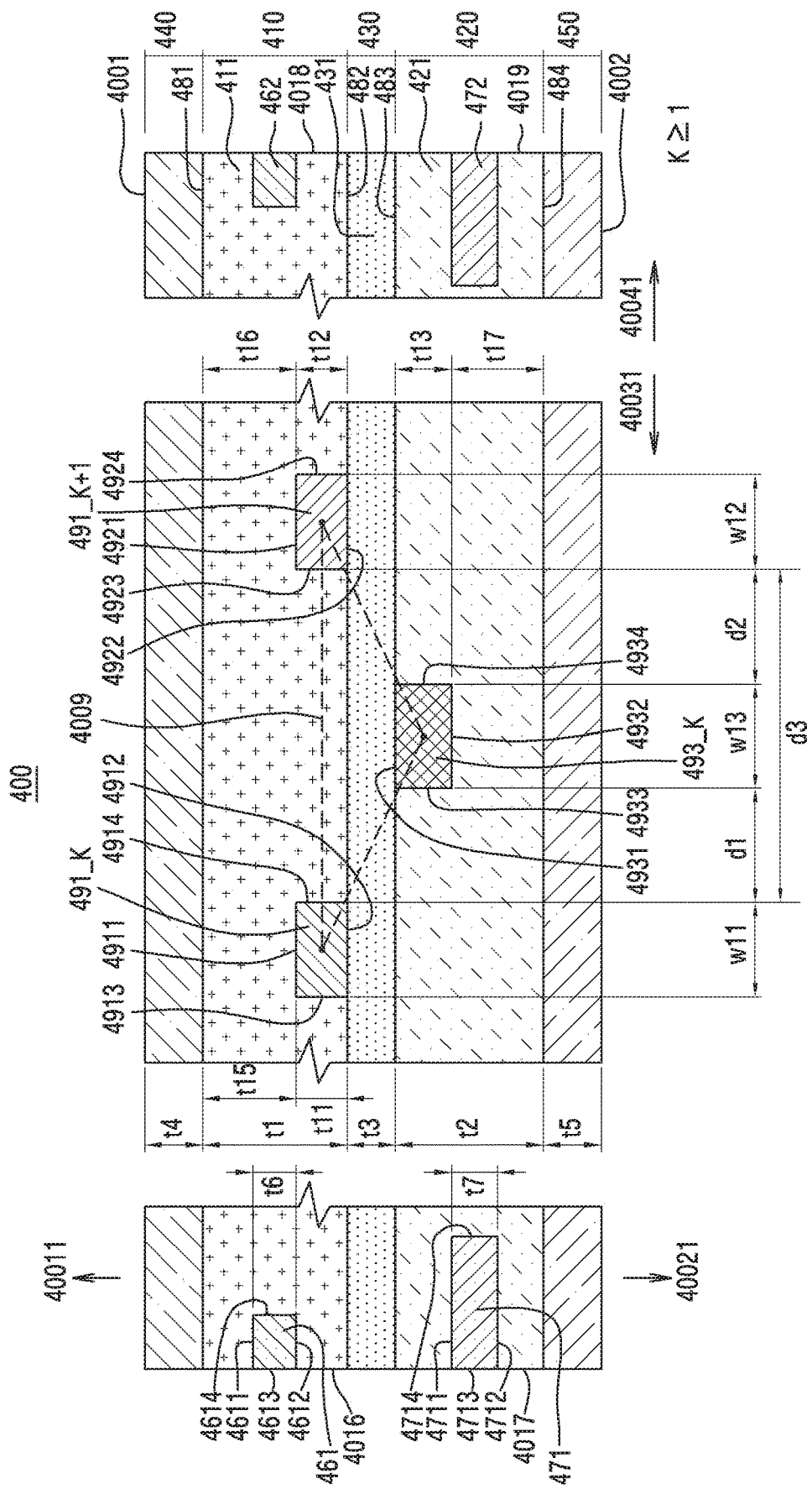
Figure 5A:
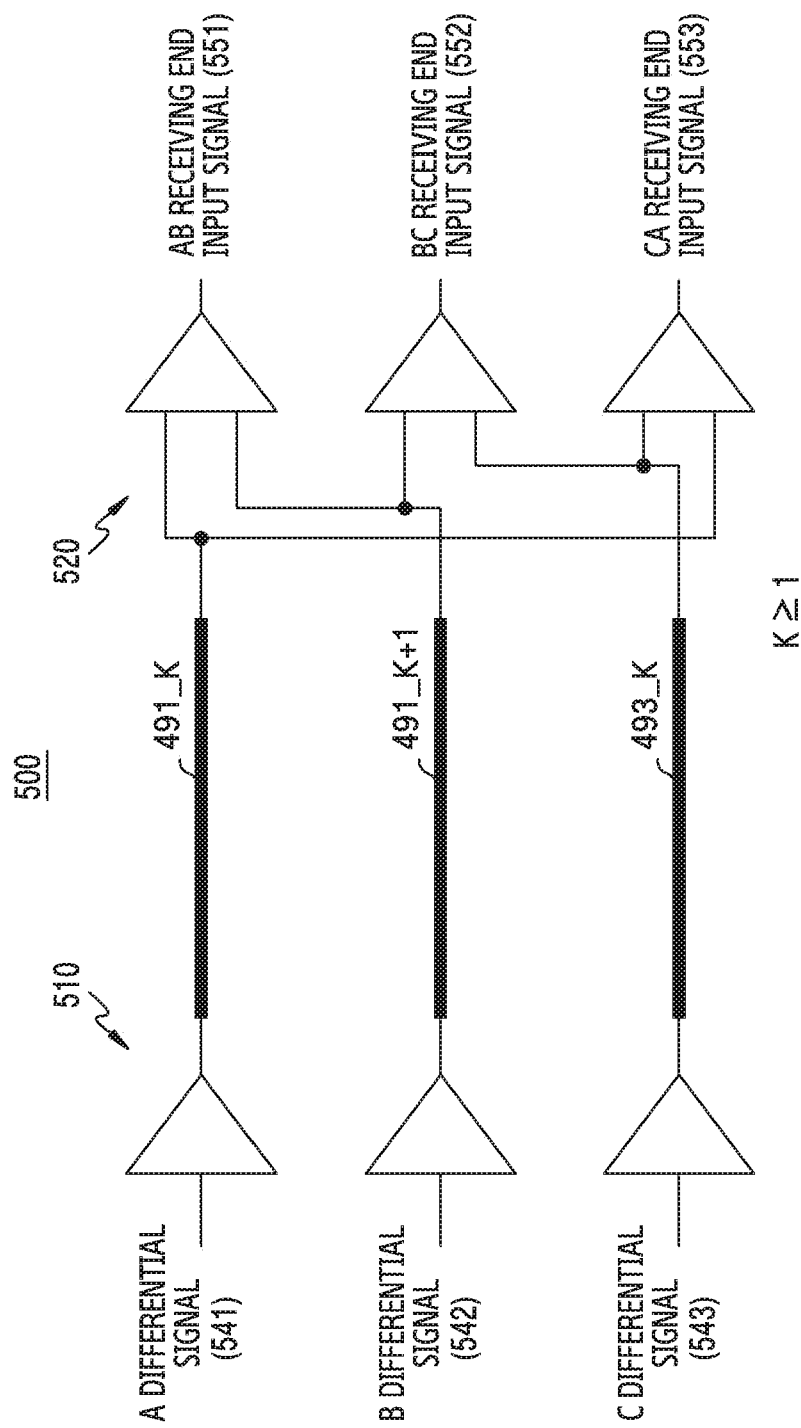
Figure 5B:
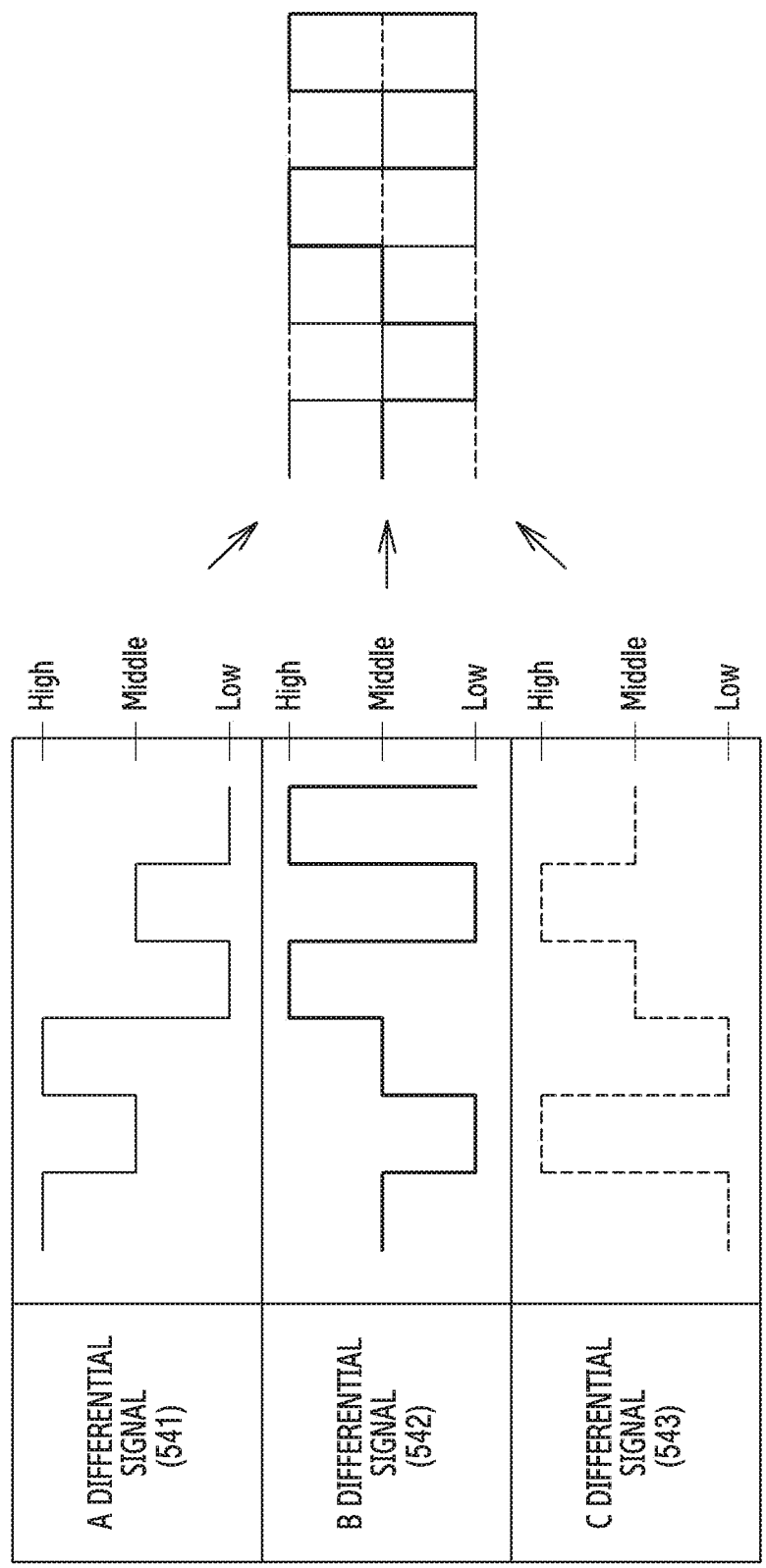

FIGS. 4A and 4B are cross-sectional views showing a structure of a substrate included in an electronic device according to one embodiment of the present invention. FIGS. 5A, 5B, 5C, 5D, 5E and 5F are illustrations for explaining an operation of processing differential signals (e.g., processing differential signals or calculating differential signals) transmitted via three signal lines according to various embodiments of the present invention. FIGS. 6A, 6B and 6C are illustrations for explaining determining design values such as a size or a dielectric constant of elements of a substrate to achieve signal integrity in transmitting differential signals via three signal lines according to various embodiments of the present invention. According to various embodiments, an electronic device (not shown) including a substrate 300 may include at least part of the elements of the electronic device 101 of FIG. 1 or the electronic device 201 of FIG. 2.

Referring to FIGS. 4A and 4B, a substrate 400 may be designed such that a plurality of signal lines 490 and a plurality of elements coupled with them are disposed. According to one embodiment, a group including two signal lines or three signal lines of the plurality of the signal lines 490 may be used as a path for transmitting differential signals of data if the data is transmitted between the transmitting side and the receiving side. Hereafter, in explaining the plurality of the signal lines 490 and other relevant elements of the substrate 400, for example, if an element A, an element B and an element c are arranged in a second direction 40021 in FIGS. 4A and 4B, it may be defined that 'the element A is disposed above the element B, and the element C is disposed under or beneath the element B'.

Referring to FIGS. 4A and 4B, the substrate 400 may include a plurality of layers. According to one embodiment, the substrate 400 may include a second layer 420 which is disposed under or beneath the first layer 410. The first layer 410 may include a first surface 481, and a second surface 482 disposed under or beneath the first surface 481. The second layer 420 may include a third surface 483 disposed under or beneath the second surface 482, and a fourth surface 484 disposed under or beneath the third surface 483.

According to one embodiment, the first surface 481 and the fourth surface 484 may be substantially in parallel. For example, the substrate 400 may be a rigid substrate, and may be of a flat plate type. The first surface 481 may be a flat surface facing a first direction 40011, and the fourth surface 484 may be a flat surface facing the second direction 40021 which is opposite to the first direction 40011. According to various embodiments, the second surface 482 and/or the third surface 483 may be substantially in parallel with the first surface 481 and/or the fourth surface 484.

According to various embodiments, the substrate 400 may be designed as a flexible substrate (e.g., an FPCB).

The plurality of the signal lines 490 may include a plurality of signal lines (hereafter, referred to as 'upper signal lines') 491_N included in the first layer 410 and at least one signal line (hereafter, referred to as a 'lower signal line') 493_M included in the second layer 420. The upper signal lines 491_N and the lower signal line 493_M may include a group including a first signal line 491_K, a second signal line 491_K+1 and a third signal line 493_K of a substantially triangular arrangement structure. For example, if the substrate 400 is designed to include two upper signal lines 491_1 and 491_2 and one lower signal line 493_1, there may be a group 4901 including the first upper signal line 491_1, the second upper signal line 491_2 and the first lower signal line 493_1. For example, if the substrate 400 is designed to include three upper signal lines 491_1, 491_2, and 491_3 and two lower signal lines 493_1 and 493_2, there may be the group 4901 including the first upper signal line 491-1, the second upper signal line 491_2 and the first lower signal line 493_1, or a group 4902 including the second upper signal line 491_2, the third upper signal line 491_3 and the second lower signal line 493_2.

Referring to FIG. 4B, the first signal line 491_K may included in the first layer 410, and, for example, may be disposed between the first surface 481 and the second surface 482. According to one embodiment, the first signal line 491_K may be included in the first layer 410 to form a part of the second surface 482. According to various embodiments, although not depicted, the first signal line 491_K may be disposed at various other positions between the first surface 481 and the second surface 482.

The second signal line 491_K+1 may be included in the first layer 410, and, for example, may be disposed between the first surface 481 and the second surface 482. According to one embodiment, the second signal line 491_K+1 may be included in the first layer 410 to form part of the second surface 482. According to various embodiments, although not depicted, the second signal line 491_K+1 may be disposed at various other positions between the first surface 481 and the second surface 482.

According to one embodiment, the first signal line 491_K and the second signal line 491_K+1 may be arranged in a direction (e.g., a third direction 40031 or a fourth direction 40041) perpendicular to the first direction 40011 or the second direction 40021.

The third signal line 493_K may be included in the second layer 420, and may be disposed between, for example, the third surface 483 and the fourth surface 484. According to one embodiment, the third signal line 493_K may be included in the second layer 420 to form a part of the third surface 483. According to various embodiments, although not depicted, the third signal line 493_K may be disposed at various other positions between the third surface 483 and the fourth surface 484.

According to one embodiment, when viewed from the cross section, the first signal line 491_K, the second signal line 491_K+1 or the third signal line 493_K may be rectangular. For example, the first signal line 491_K, the second signal line 491_K+1 or the third signal line 493_K may include a surface (hereafter, referred to as 'a fifth surface') 4911, 4921, and 4931 facing in the first direction 40011, a surface (hereafter, referred to as 'a sixth surface') 4912, 4922, and 4932 facing in the second direction 40021, a surface (hereafter, referred to as 'a seventh surface') 4913, 4923, and 4933 facing in the third direction 40031, and a surface (hereafter, referred to as 'an eighth surface') 4914, 4924, and 4934 facing in the fourth direction 40041. According to one embodiment, the sixth surfaces 4912 and 4922 of the first and second signal lines 491_K and 491_K+1 may form part of the second surface 482. The fifth surface 4831 of the third signal line 493_K may form part of the third surface 483. According to various embodiments, although not depicted, the first signal line 491_K, the second signal line 491_K+1 or the third signal line 493_K may be designed in various different cross-sectional shapes. For example, the cross sections of the first signal line 491_K, the second signal line 491_K+1 or the third signal line 493_K may be circular. According to various embodiments, at least two of the first signal line 491_K, the second signal line 491_K+1 and the third signal line 493_K may be designed to have different cross-sectional shapes. For example, the first signal line 491_K or the second signal line 491_K+1 may have a circular cross sectional shape, and the third signal line 493_K may have a circular cross sectional shape.

According to one embodiment, the first signal line 491_K, the second signal line 491_K+1 and the third signal line 493_K may be arranged to be disposed at three vertices of a virtual triangle. The third signal line 493_K may be disposed at a position away from the first signal line 491_K by a first distance d1 in a direction (e.g., the fourth direction 40041) heading from the first signal line 491_K to the second signal line 491_K+1. The third signal line 493_K may be disposed at a position away from the second signal line 491_K+1 by a second distance d2 in a direction (e.g., the third direction 40031) heading from the second signal line 491_K+1 to the first signal line 491_K. The third signal line 493_K may be disposed at a position away from the first signal line 491_K or the second signal line 491_K+1 by a distance t3 between the second surface 482 and the third surface 483 in the second direction 40021.

According to one embodiment, the first distance d1 and the second distance d2 may be substantially equal. For example, the first signal line 491_K, the second signal line 491_K+1, and the third signal line 493_K may be arranged to be disposed at three vertices of a virtual isosceles triangle 4009.

The first layer 410 may include a first dielectric 411 having a first dielectric constant. According to one embodiment, the first dielectric 411 may cover the fifth surfaces 4911 and 4921, the seventh surfaces 4913 and 4923 and the eighth surfaces 4914 and 4924 of the first and second signal lines 491_K and 491_K+1, and may form the first surface 481 and part of the second surface 482. The first dielectric 411 may form the second surface with the sixth surfaces 4912 and 4922 of the first and second signal lines 491_K and 491_K+1. According to various embodiments, although not depicted, if the first dielectric 411 is designed to cover up to the sixth surfaces 4912 and 4922 of the first and second signal lines 491_K and 491_K+1, the whole area of the second surface 482 may be formed by the first dielectric 411.

The second layer 420 may include a second dielectric 421 having a second dielectric constant. According to one embodiment, the second dielectric 421 may cover the sixth surface 4932, the seventh surface 4933 and the eighth surface 4934 of the third signal line 493_K and may form the fourth surface 484 and part of the third surface 483. The second dielectric 421 may form the third surface 483 with the fifth surface 4931 of the third signal line 493_K. According to various embodiments, although not depicted, if the second dielectric 421 is designed to cover up to the fifth surface 4931 of the third signal line 493_K, the whole area of the third surface 483 may be formed by the second dielectric 421.

According to one embodiment, the substrate 400 may include at least one layer disposed between the first layer 410 and the second layer 420. For example, the substrate 400 may include a third layer 430 disposed between the first layer 410 and the second layer 420. The third layer 430 may be coupled with the second surface 482 of the first layer 410, and the third surface 483 of the second layer 420. According to one embodiment, the first layer 410 and the second layer 420 may be electrically separated by the third layer 430. For example, the third signal line 493_K may be physically or electrically separated from the first and second signal lines 491_K and 491_K+1 due to the three layers 430. According to one embodiment, the third layer 430 may include at least part of the third dielectric 431 having the third dielectric constant. According to various embodiments, the third dielectric 431 may be formed of polyimide and various materials.

According to various embodiments, the first dielectric 411, the second dielectric 421 or the third dielectric 431 may be formed of the same or different materials. According to various embodiments, the first dielectric constant of the first dielectric 411, the second dielectric constant of the second dielectric 421 or the third dielectric constant of the third dielectric 431 may be the same or different from each other.

According to various embodiments, the substrate 400 may be designed to further include a fourth layer 440 coupled to at least part of the first surface 481 of the first layer 410. The fourth layer 440 may include a conductive material, and may be used as the ground. Due to the fourth layer 440, the substrate 400 may include a substrate upper surface 4001 disposed on the first surface 481. The substrate upper surface 4001 may be substantially in parallel with the first surface 481.

According to various embodiments, the substrate 400 may be designed to further include a fifth layer 450 coupled to at least part of the fourth surface 484 of the second layer 420. The fifth layer 450 may include a conductive material, and may be used as the ground. Due to the fifth layer 450, the substrate 400 may include a substrate lower surface 4002 disposed under or beneath the fourth surface 484. The substrate lower surface 4002 may be substantially in parallel with the fourth surface 484.

According to various embodiments, the first layer 410 may be designed to further include at least one conductive layer. The at least one conductive layer may be used as the ground. For example, the first layer 410 may include a conductive sixth layer 461 disposed between the first surface 481 and the second surface 482. According to one embodiment, the sixth layer 461 may be disposed adjacent to a side surface 4016 of the first layer 410, and, when viewed in the second direction 40021, may be in a plate shape extended not to overlap with the first signal line (e.g., the first upper signal line 491_1 of FIG. 4A) near the side surface 4016. For example, the sixth layer 461 may include a surface (hereafter, referred to as 'a ninth surface') 4611 facing in the first direction 40011, a surface (hereafter, referred to as 'a tenth surface') 4612 facing in the second direction 40021, a surface (hereafter, referred to as 'an eleventh surface') 4613 facing in the third direction 40031, and a surface (hereafter, referred to as 'a twelfth surface') 4614 facing in the fourth direction 40041. According to one embodiment, the first dielectric 411 may cover the ninth surface 4611, the tenth surface 4612 and the twelfth surface 4614 of the sixth layer 461, and may form the side surface 4016 of the first layer 410 with the eleventh surface 4613 of the sixth layer. According to various embodiments, although not depicted, the first dielectric 411 may be designed to cover up to the eleventh surface 4613 of the sixth layer 461. According to various embodiments, although not depicted, the tenth surface 4612 of the sixth layer 461 may be disposed to form a part of the second surface 482. According to various embodiments, although not depicted, the ninth surface 4611 of the sixth layer 461 may be disposed to form a part of the first surface 481. According to various embodiments, the substrate 400 may further include a conductive layer 462 disposed adjacent to the other side surface 4018 of the first layer 410, and this conductive layer 462 may be designed similarly to the sixth layer 461.

According to various embodiments, the second layer 420 may be designed to further include at least one conductive layer. The at least one conductive layer may be used as the ground. For example, the second layer 420 may include a conductive seventh layer 471 disposed between the third surface 483 and the fourth surface 484. According to one embodiment, the seventh layer 471 may be disposed adjacent to a side surface 4017 of the second layer 420, and, when viewed in the second direction 40021, may be in a plate shape extended not to overlap with the first signal line (e.g., the first upper signal line 491_1 of FIG. 4A) near the side surface 4017. For example, the seventh layer 471 may include a surface (hereafter, referred to as 'a thirteenth surface') 4711 facing in the first direction 40011, a surface (hereafter, referred to as 'a fourteenth surface') 4712 facing in the second direction 40021, a surface (hereafter, referred to as 'a fifteenth surface') 4713 facing in the third direction 40031, and a surface (hereafter, referred to as 'a sixteenth surface') 4714 facing in the fourth direction 40041. According to one embodiment, the second dielectric 421 may cover the thirteenth surface 4711, the fourteenth surface 4712 and the sixteenth surface 4714 of the seventh layer 471, and may form the side surface 4017 of the second layer 420 with the fifteenth surface 4713 of the seventh layer 471. According to various embodiments, although not depicted, the second dielectric 421 may be designed to cover up to the thirteenth surface 4713 of the seventh layer 471. According to various embodiments, although not depicted, the thirteenth surface 4713 of the seventh layer 471 may be disposed to form a part of the third surface 483. According to various embodiments, although not depicted, the twelfth surface 4712 of the seventh layer 471 may be disposed to form a part of the fourth surface 484. According to various embodiments, the substrate 400 may further include a conductive layer 472 disposed adjacent to the other side surface 4019 of the second layer 420, and this conductive layer 472 may be designed similarly to the seventh layer 471.

According to one embodiment, the electronic device may select two signal lines from the first signal line 491_K, the second signal line 491_K+1 and the third signal line 493_K, and transmit differential signals of data to transmit from the transmitting side to the receiving side via the two selected signal lines. For example, the electronic device may include a plurality of transmitting ends and receiving ends which are not shown, connected to a plurality of signal lines. If transmitting data (or information) from the transmitting end to the receiving end, the transmitting end may generate a first differential signal and a second differential signal of the data to transmit, and transmit the generated first differential signal and second differential signal to the receiving end through the two selected signal lines respectively.

The first differential signal and the second differential signal may be signals of different levels. According to various embodiments, the first differential signal and the second differential signal may be complementary signals. According to various embodiments, the first differential signal and the second differential signal may be signals having opposite polarities or opposite phases. For example, the first differential signal is the signal of a high level, and the second differential signal may be the signal of a low level. The receiving end may obtain information or data (e.g., process the differential signals or calculate the differential signals) based on the individual signal, an electrical difference (e.g., a difference signal) between the first differential and second differential signals, or an electrical sum (or a sum signal) of the first and second difference signals. If transmitting end impedance and receiving end impedance are equal in a circuit which performs the differential signal processing, external electromagnetic interference may exert the same effect on the two selected lines. The receiving end may cancel the external electromagnetic interference based on the difference signal between the first and second differential signals.

According to various embodiments, the electronic device may select all of the first signal line 491_K, the second signal line 491_K+1 and the third signal line 493_K, and transmit differential signals of data to transmit from the transmitting end to the receiving end via the three selected signal lines. For example, if transmitting data (or information) from the transmitting end to the receiving end, the transmitting end may generate and transmit an A differential signal, a B differential signal and a C differential signal of the data to transmit to the receiving end via the three signal lines respectively. According to one embodiment, the A differential signal, the B differential signal and the C differential signal may be signals of different levels. FIG. 5A depicts a transmitting/receiving circuit 500 using three signal lines (e.g., 491_K, 491_K+1, 493_K of FIG. 4B). FIG. 5B depicts levels of differential signals transmitted via the three signal lines 491_K, 491_K+1, and 493_K. Referring to FIG. 5A, the transmitting/receiving circuit 500 may include a single-ended field of transmitters 510, a differential field of receivers 520 and the three signal lines 491_K, 491_K+1, and 493_K. According to one embodiment, the transmitters may include a master integrated circuit (IC) (e.g., the processor 120 of FIG. 1 or the processor 210 of FIG. 2), and the receivers may include a slave IC (e.g., elements connected to the processor 120 and exchanging signals in the electronic device 101 of FIG. 1, or various modules connected to the processor 210 and exchanging signals in the electronic device 201 of FIG. 2). The transmitters may include the slave IC (e.g., the elements connected to the processor 120 and exchanging signals in the electronic device 101 of FIG. 1, or various modules connected to the processor 210 and exchanging signals in the electronic device 201 of FIG. 2), and the receivers may include the master IC (e.g., the processor 120 of FIG. 1 or the processor 210 of FIG. 2). Referring to FIG. 5A, the single-ended field of transmitters 510 may generate an A differential signal 541, a B differential signal 542 and a C differential signal 543 of data to transmit. The single-ended field of transmitters 510 may transmit the A differential signal (e.g., an A single-ended input signal or a transmitting end A signal) 541 to the differential field of receivers 520 via the first signal line 491_K. The single-ended field of transmitters 510 may transmit the B differential signal (e.g., a B single-ended input signal or a transmitting end B signal) 542 to the differential field of receivers 520 via the second signal line 491_K+1. The single-ended field of transmitters 510 may transmit the C differential signal (e.g., a C single-ended input signal or a transmitting end C signal) 543 to the differential field of receivers 520 via the third signal line 493_K.

According to one embodiment, the A differential signal 541, the B differential B 542 and the C differential signal 543 may be complementary signals. For example, referring to FIG. 5B, the A differential signal 541 may indicate one of the high level, the middle level and the low level. The B differential signal 542 may indicate one of the high level, the middle level and the low level, and indicate a different level from the A differential signal 541. The C differential signal 543 may indicate one of the high level, the middle level and the low level, and indicate a different level from the A differential signal 541 and the B differential signal 542.

In one embodiment, referring to FIG. 5B, at a first transmission, the single-ended field of transmitters 510 may transmit the A differential signal 541 of the high level, the B differential signal 542 of the low level, and the C differential signal 543 of the middle level to the differential field of receivers 520. At a second transmission, the single-ended field of transmitters 510 may transmit the A differential signal 541 of the low level, the B differential signal 542 of the high level, and the C differential signal 543 of the middle level to the differential field of receivers 520. At a third transmission, the single-ended field of transmitters 510 may transmit the A differential signal 541 of the middle level, the B differential signal 542 of the high level, and the C differential signal 543 of the low level to the differential field of receivers 520. At a fourth transmission, the single-ended field of transmitters 510 may transmit the A differential signal 541 of the middle level, the B differential signal 542 of the low level, and the C differential signal 543 of the high level to the differential field of receivers 520. At a fifth transmission, the single-ended field of transmitters 510 may transmit the A differential signal 541 of the low level, the B differential signal 542 of the middle level, and the C differential signal 543 of the high level to the differential field of receivers 520. At a sixth transmission, the single-ended field of transmitters 510 may transmit the A differential signal 541 of the high level, the B differential signal 542 of the middle level, and the C differential signal 543 of the low level to the differential field of receivers 520.

Referring to FIG. 5A, in the first through sixth transmissions, the differential field of receivers 520 may acquire the receiving end input signal (or the receiver input signal) by comparing the A differential signal 541, the B differential signal 542 and the C differential signal 543. For example, the differential field of receivers 520 may obtain an AB receiving end input signal 551 in relation to the electric difference between the A differential signal 541 and the B differential signal 542. The differential field of receivers 520 may obtain a BC receiving end input signal 552 in relation to the electric difference between the B differential signal 542 and the C differential signal 543. The differential field of receivers 520 may obtain a CA receiving end input signal 553 in relation to the electric difference between the C differential signal 543 and the A differential signal 541.

FIGS. 5C and 5D are tables of a wire state determined based on voltage (signal voltage, or wire amplitude) of the A differential signal A (e.g., 541 of FIG. 5A), the B differential signal B (e.g., 542 of FIG. 5A) and the C differential signal C (e.g., 543 of FIG. 5A) transmitted via three signal lines (e.g., 491_K, 491_K+1, 493_K of FIG. 5A), in the signal transmission using the differential signals according to one embodiment.

According to various embodiments, the tables shown in FIGS. 5C and 5D may comply with mobile industry processor interface (MIPI) C-physical layer (Phy) standard.

Referring to FIG. 5C, the single-ended field of transmitters (e.g., 510 of FIG. 5A) may transmit the A differential signal A to the differential field of receivers (e.g., 520 of FIG. 5A) via the first signal line (e.g., 491_K of FIG. 5A). The single-ended field of transmitters (e.g., 510 of FIG. 5A) may transmit the B differential signal B to the differential field of receivers (e.g., 520 of FIG. 5A) via the second signal line 491_K+1. The single-ended field of transmitters (e.g., 510 of FIG. 5A) may transmit the C differential signal C to the differential field of receivers (e.g., 520 of FIG. 5A) via the third signal line 493_K+1. According to one embodiment, if the A differential signal A, the B differential signal B and the C differential signal C are transmitted, the voltage (e.g., wire amplitude or single-ended input voltage) indicating the A differential signal A, the B differential signal B and the C differential signal C may be shifted. According to one embodiment, the voltage of the A differential signal A, the B differential signal B and the C differential signal C may be shifted between ¾V, ½V and ¼V. For example, at the first transmission, the voltage of the A differential signal A may be ¾V, the voltage of the B differential signal B may be ¼V, and the voltage of the C difference signal C may be ½V. At the second transmission, the voltage of the A differential signal A may be ¼V, the voltage of the B differential signal B may be ¾V, and the voltage of the C difference signal C may be ½V. At the third transmission, the voltage of the A differential signal A may be ½V, the voltage of the B differential signal B may be ¾V, and the voltage of the C difference signal C may be ¼V. At the fourth transmission, the voltage of the A differential signal A may be ½V, the voltage of the B differential signal B may be ¼V, and the voltage of the C difference signal C may be ¾V. At the fifth transmission, the voltage of the A differential signal A may be ¼V, the voltage of the B differential signal B may be ½V, and the voltage of the C difference signal C may be ¾V. At the sixth transmission, the voltage of the A differential signal A may be ¾V, the voltage of the B differential signal B may be ½V, and the voltage of the C difference signal C may be ¼V.

In various embodiments, referring to FIG. 5D, if the voltage (e.g., the single-ended input voltage) of the differential signal A, B or C transmitted from the single-ended field of transmitters (e.g., 510 of FIG. 5A) is ¾V, the voltage of the differential signal may be defined to correspond to the 'high' signal level (e.g., line signal levels). If the voltage (e.g., the single-ended input voltage) of the differential signal A, B or C transmitted from the single-ended field of transmitters (e.g., 510 of FIG. 5A) is ½V, the voltage of the differential signal may be defined to correspond to the 'middle' signal level. If the voltage (e.g., the single-ended input voltage) of the differential signal A, B or C transmitted from the single-ended field of transmitters (e.g., 510 of FIG. 5A) is ¼V, the voltage of the differential signal may be defined to correspond to the 'low' signal level.

The differential field of receivers (e.g., 520 of FIG. 5A) may obtain the receiving end input signal (or the receiver input signal) (e.g., 551, 552 or 553 of FIG. 5A) by comparing the differential signals A, B, and C transmitted via the three signal lines (e.g., 491_K, 491_K+1, 493_K of FIG. 5A). According to one embodiment, the differential field of receivers 520 may acquire an A-B receiving end input signal A-B (e.g., the AB receiving end input signal 551 of FIG. 5A) which is the differential between the A differential signal A and the B differential signal B. The differential field of receivers 520 may acquire a B-C receiving end input signal B-C (e.g., the BC receiving end input signal 552 of FIG. 5A) which is the differential between the B differential signal B and the C differential signal C. The differential field of receivers 520 may acquire a C-A receiving end input signal C-A (e.g., the CA receiving end input signal 553 of FIG. 5A) which is the differential between the C differential signal C and the A differential signal A. The voltage (e.g., receiver differential input voltage or receiving end input voltage) of the A-B receiving end input signal A-B, the B-C receiving end input signal B-C or the C-A receiving end input signal C-A may be −¼V, +¼V, −½V or +½V.

Referring to FIG. 5C, the differential field of receivers 520 may generate a receiving end output signal (or receiver digital output) based on the voltage of the receiving end input signal A-C, B-C or C-A. For example, if the voltage of the receiving end input signal A-C, B-C or C-A is $+V^{1/4}$ or $+V^{1/2}$, the differential field of receivers 520 may generate (modulate) a digital output value (e.g., receiver digital output) '1' as the receiving end output signal. If the voltage of the receiving end input signal A-C, B-C or C-A is $-V^{1/4}$ or $-V^{1/2}$, the differential field of receivers 520 may generate a digital output value '0' as the receiving end output signal.

Referring to FIGS. 5C and 5D, depending on the level (e.g., high level, middle level, low level) of the A differential signal A, the B differential signal B and the C differential signal C, six wire state may be defined.

According to one embodiment, the differential field of receivers (e.g., 520 of FIG. 5A) may generate (or extract) a wire status name referred to as '+x', '−x', '+x', '−y', '+z' and '−z' according to the level (e.g., the voltage) of the A differential signal A, the B differential signal B and the C differential signal C. For example, if the A differential signal A of the high level, the B differential signal B of the low level, and the C differential signal C of the middle level are transmitted from the single-ended field of transmitters (e.g., 510 of FIG. 5A) to the differential field of receivers (e.g., 520 of FIG. 5A), the wire state name may be defined as '+x'. If the A differential signal A of the low level, the B differential signal B of the high level, and the C differential signal C of the middle level are transmitted from the single-ended field of transmitters 510 to the differential field of receivers 520, the wire state name may be defined as '−x'. If the A differential signal A of the middle level, the B differential signal B of the high level, and the C differential signal C of the low level are transmitted from the single-ended field of transmitters 510 to the differential field of receivers 520, the wire state name may be defined as '+y'. If the A differential signal A of the middle level, the B differential signal B of the low level, and the C differential signal C of the high level are transmitted from the single-ended field of transmitters 510 to the differential field of receivers 520, the wire state name may be defined as '−y'. If the A differential signal A of the low level, the B differential signal B of the middle level, and the C differential signal C of the high level are transmitted from the single-ended field of transmitters 510 to the differential field of receivers 520, the wire state name may be defined as '+z'. If the A differential signal A of the high level, the B differential signal B of the middle level, and the C differential signal C of the low level are transmitted from the single-ended field of transmitters 510 to the differential field of receivers 520, the wire state name may be defined as '−z'.

According to various embodiments, the differential field of receivers (e.g., 520 of FIG. 5A) may generate (or extract) a high-speed state code name referred to as 'HS_+X', 'HS_−X', 'HS_+Y', 'HS_−Y', 'HS_+Z' and 'HS_−Z' according to the level (e.g., the voltage) of the A differential signal A, the B differential signal B and the C differential signal C. For example, if the A differential signal A of the high level, the B differential signal B of the low level, and the C differential signal C of the middle level are transmitted from the single-ended field of transmitters (e.g., 510 of FIG. 5A) to the differential field of receivers (e.g., 520 of FIG. 5A), the high-speed state code name may be defined as 'HS_+X'. If the A differential signal A of the low level, the B differential signal B of the high level, and the C differential signal C of the middle level are transmitted from the single-ended field of transmitters 510 to the differential field of receivers 520, the high-speed state code may be defined as 'HS_−X'. If the A differential signal A of the middle level, the B differential signal B of the high level, and the C differential signal C of the low level are transmitted from the single-ended field of transmitters 510 to the differential field of receivers 520, the high-speed state code may be defined as 'HS_+Y'. If the A differential signal A of the middle level, the B differential signal B of the low level, and the C differential signal C of the high level are transmitted from the single-ended field of transmitters 510 to the differential field of receivers 520, the high-speed state code may be defined as 'HS_−Y'. If the A differential signal A of the low level, the B differential signal B of the middle level, and the C differential signal C of the high level are transmitted from the single-ended field of transmitters 510 to the differential field of receivers 520, the high-speed state code may be defined as 'HS_+Z'. If the A differential signal A of the high level, the B differential signal B of the middle level, and the C differential signal C of the low level are transmitted from the single-ended field of transmitters 510 to the differential field of receivers 520, the high-speed state code may be defined as 'HS_−Z'.

The differential field of receivers 520 may acquire (or extract) information or data based on the determined wire state (e.g., the wire state defined as the name '+x', '−x', '−y', '−z' and '−z', or the high-speed state code defined as the name 'HS_+X', 'HS_−X', 'HS_+Y', 'HS_−Y', 'HS_+Z' and 'HS_−Z'). For example, the differential field of receivers 520 may determine a symbol value according to a condition which changes the extracted wire state, and acquire (decode) the information or the data based on the symbol value.

Figure 5E:
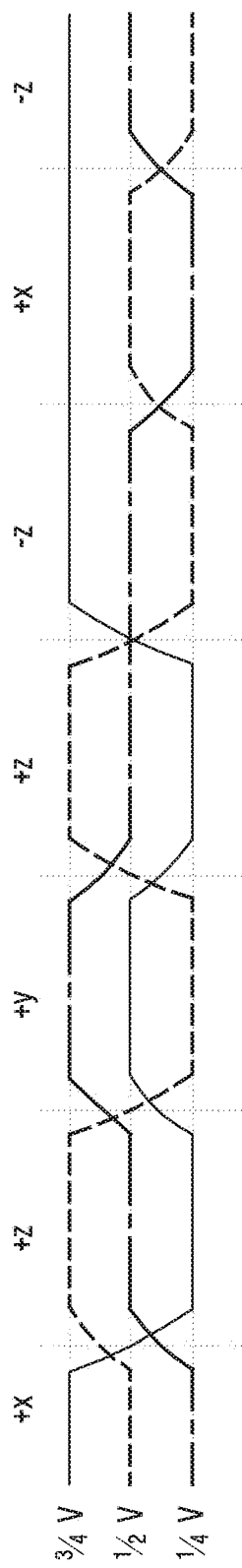

According to various embodiments, FIG. 5E illustrates the voltage (e.g., single-ended input voltage) of the differential signals (e.g., the single-ended input signals) transmitted via three signal lines (e.g., 491_K, 491_K+1, 493_K of FIG. 4B) according to one embodiment of the present invention. According to various embodiments, FIG. 5F illustrates the receiving end input signals acquired by comparing the differential signals transmitted via three signal lines (e.g., 491_K, 491_K+1, 493_K of FIG. 4B) according to one embodiment of the present invention.

Referring to FIG. 5E, the single-ended field of transmitters (e.g., 510 of FIG. 5A) may transmit the A differential signal (e.g., the A single-ended input signal) 571 to the differential field of receivers (e.g., 520 of FIG. 5A) via the first signal line 491_K. The single-ended field of transmitters (e.g., 510 of FIG. 5A) may transmit the B differential signal (e.g., the B single-ended input signal) 572 to the differential field of receivers (e.g., 520 of FIG. 5A) via the second signal line 491_K+1. The single-ended field of transmitters (e.g., 510 of FIG. 5A) may transmit the C differential signal (e.g., the C single-ended input signal) 573 to the differential field of receivers (e.g., 520 of FIG. 5A) via the third signal line 493_K. According to one embodiment, if the A differential signal 571, the B differential signal 572 and the C differential signal 573 are transmitted via the three signal lines 491_K, 491_K+1 and 493_K, the A differential signal 571, the B differential signal 572 and the C differential signal 573 may be shifted to different voltages. In one embodiment, referring to FIG. 5E, the voltage $V_A$ of the A differential signal 571, the voltage $V_B$ of the B differential signal 572 and the voltage $V_C$ of the C differential signal 573 may be shifted between a first level (e.g., ¾V) (hereafter, 'high level'), a second level (e.g., ½V) (hereafter, 'middle' level), and a third level (e.g., ¼V) (hereafter, 'low' level).

Figure 5F:
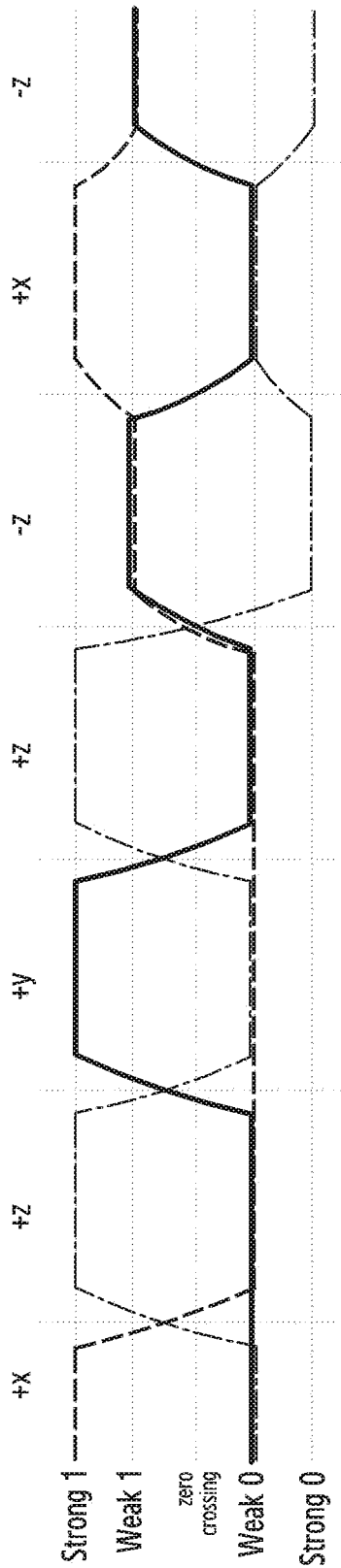
Figure 6A:
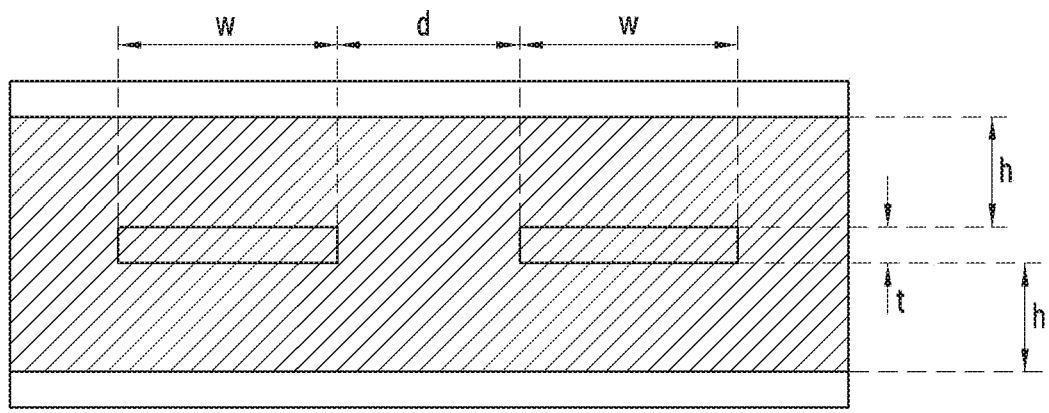
FIGS. 6A, 6B and 6C are illustrations for explaining determining design values such as a size of elements of a substrate or a dielectric constant to achieve signal integrity in transmitting differential signals via three signal lines according to various embodiments of the present invention.
Figure 6B:
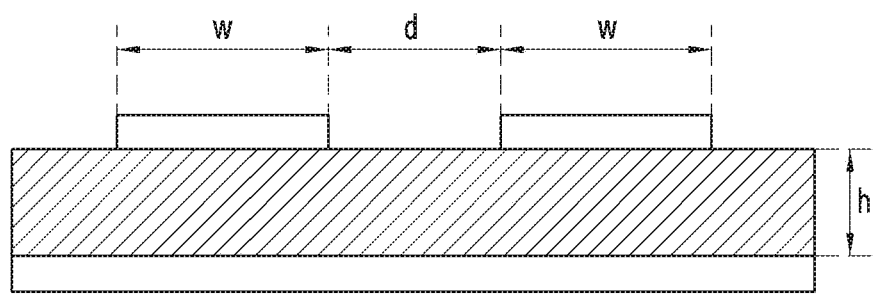
Figure 6C:
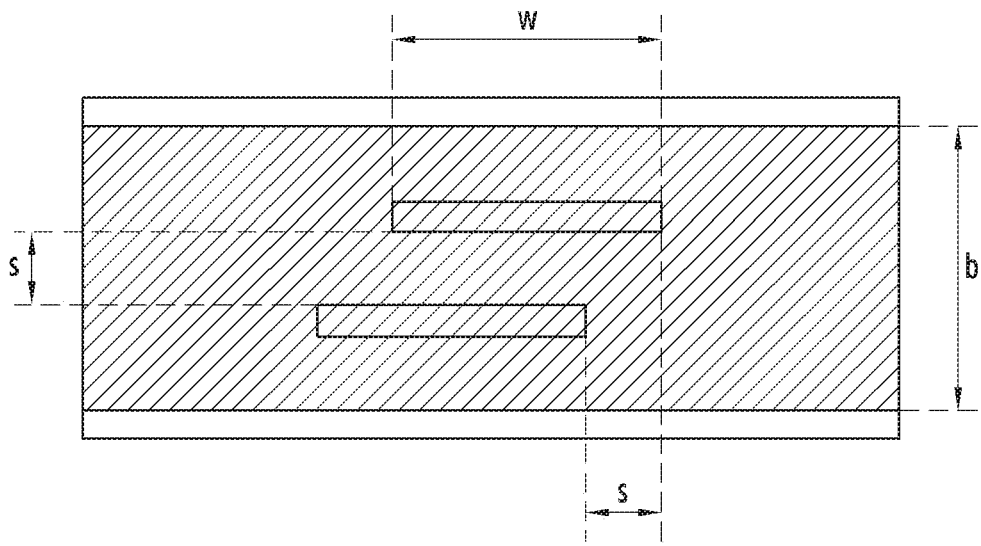

Referring to FIG. 5F, the differential field of receivers (e.g., 520 of FIG. 5A) may acquire the receiving end input signal by comparing the differential signals (e.g., the A differential signal 571, the B differential signal 572 and the C differential signal 573 of FIG. 5E) transmitted via the three signal lines (e.g., 491_K, 491_K+1, 493_K of FIG. 4B). According to various embodiments, the differential field of receivers 520 may acquire an AB receiving end input signal 581 (e.g., 551 of FIG. 5A) relating to the electrical difference between the A differential signal 571 and the B differential signal 572. The differential field of receivers 520 may acquire a BC receiving end input signal 582 (e.g., 552 of FIG. 5A) relating to the electrical difference between the B differential signal 572 and the C differential signal 573. The differential field of receivers 520 may acquire a CA receiving end input signal 583 (e.g., 553 of FIG. 5A) relating to the electrical difference between the C differential signal 573 and the A differential signal 571. According to one embodiment, the wire state may be determined based on the voltage $V_A$ of the A differential signal 571, the voltage $V_B$ of the B differential signal 572 and the voltage $V_C$ of the C differential signal 573. According to one embodiment, the differential field of receivers 520 may determine the wire state based on a voltage difference (e.g., 'Strong 1' level, 'Weak 1' level, 'Weak 0' level or 'Strong 0' level) indicating the AB receiving end input signal 581, the BC receiving end input signal 582 and the CA receiving end input signal 583.

Referring to FIGS. 5E and 5F, for example, in association with the '+x' wire state, the A differential signal 571 may be transmitted with the voltage $V_A$ of the high level, the B differential signal 572 may be transmitted with the voltage $V_B$ of the low level, and the C differential signal 573 may be transmitted with the voltage $V_C$ of the middle level. In this case, the AB receiving end input signal 581 may indicate a voltage difference $V_{AB\_diff}$ of 'Strong 1' level, the BC receiving end input signal 582 may indicate a voltage difference $V_{BC\_diff}$ of 'Weak 0' level, and the CA receiving end input signal 583 may indicate a voltage difference $V_{CA\_diff}$ of 'Weak 0' level. The differential field of receivers 520 may determine the '+x' wire state based on the voltage differences $V_{AB\_diff}$, $V_{AB\_diff}$ and $V_{AB\_diff}$ indicating the receiving end input signals 581, 582 and 583.

Referring to FIGS. 5E and 5F, for example, in association with the '+z' wire state, the A differential signal 571 may be transmitted with the voltage $V_A$ of the low level, the B differential signal 572 may be transmitted with the voltage $V_B$ of the middle level, and the C differential signal 573 may be transmitted with the voltage $V_C$ of the high level. In this case, the AB receiving end input signal 581 may indicate the voltage difference $V_{AB\_diff}$ of 'Weak 0' level, the BC receiving end input signal 582 may indicate the voltage difference $V_{BC\_diff}$ of 'Weak 0' level, and the CA receiving end input signal 583 may indicate the voltage difference $V_{CA\_diff}$ of 'Strong 1' level. The differential field of receivers 520 may determine the '+z' wire state based on the voltage differences $V_{AB\_diff}$, $V_{AB\_diff}$ and $V_{AB\_diff}$ indicating the receiving end input signals 581, 582 and 583.

Referring to FIGS. 5E and 5F, for example, in association with the '+y' wire state, the A differential signal 571 may be transmitted with the voltage $V_A$ of the middle level, the B differential signal 572 may be transmitted with the voltage $V_B$ of the high level, and the C differential signal 573 may be transmitted with the voltage $V_C$ of the low level. In this case, the AB receiving end input signal 581 may indicate the voltage difference $V_{AB\_diff}$ of 'Weak 0' level, the BC receiving end input signal 582 may indicate the voltage difference $V_{BC\_diff}$ of 'Strong 1' level, and the CA receiving end input signal 583 may indicate the voltage difference $V_{CA\_diff}$ of 'Weak 0' level. The differential field of receivers 520 may determine the '+y' wire state based on the voltage differences $V_{AB\_diff}$, $V_{AB\_diff}$ and $V_{AB\_diff}$ indicating the receiving end input signals 581, 582 and 583.

Referring to FIGS. 5E and 5F, for example, in association with the '−z' wire state, the A differential signal 571 may be transmitted with the voltage $V_A$ of the high level, the B differential signal 572 may be transmitted with the voltage $V_B$ of the middle level, and the C differential signal 573 may be transmitted with the voltage $V_C$ of the low level. In this case, the AB receiving end input signal 581 may indicate the voltage difference $V_{AB\_diff}$ of 'Weak 1' level, the BC receiving end input signal 582 may indicate the voltage difference $V_{BC\_diff}$ of 'Weak 1' level, and the CA receiving end input signal 583 may indicate the voltage difference $V_{CA\_diff}$ of 'Strong 0' level. The differential field of receivers 520 may determine the '−z' wire state based on the voltage differences $V_{AB\_diff}$, $V_{AB\_diff}$ and $V_{AB\_diff}$ indicating the receiving end input signals 581, 582 and 583.

According to various embodiments, the differential field of receivers 520 may determine (or extract) the wire state of the name '+x', '−x', '+y', '−y', '+z' or '−z' based on the table of FIG. 5C or 5D. According to various embodiments, the differential field of receivers 520 may determine the high-speed state code of the name 'HS_+X', 'HS_−X', 'HS_+Y', 'HS_−Y', 'HS_+Z' or 'HS_−Z' based on the table of FIG. 5D.

According to one embodiment, the differential field of receivers 520 may acquire (or extract) information or data based on the determined wire state. For example, the differential field of receivers 520 may determine the symbol value according to the condition which changes the extracted wire state, and acquire (decode) the information or the data based on the symbol value.

According to one embodiment, an impedance value formed between the first signal line 491_K and the second signal line 491_K+1 may be designated substantially the same as an impedance value (e.g., 100 Ohm) corresponding to a designated frequency. The impedance value substantially the same as the impedance value corresponding to the designated frequency may be designed to be formed between the first signal line 491_K and the third signal line 493_K. The impedance value substantially the same as the impedance value corresponding to the designated frequency may be designed to be formed between the second signal line 491_K+1 and the third signal line 493_K. If the impedance value formed between the first signal line 491_K and the second signal line 491_K+1, the impedance value formed between the first signal line 491_K and the third signal line 493_K, and the impedance value formed between the second signal line 491_K+1 and the third signal line 493_K are designed substantially the same, the signal integrity may be obtained in the data transmission using the differential signals transmitted via the plurality of the signal lines of the first signal line 491_K, the second signal line 491_K+1 and the third signal line 493_K between the single-ended field of transmitters 510 and the differential field of receivers 520 at the transmitting/receiving circuit (500 of FIG. 5A).

According to one embodiment, the impedance value corresponding to the designated frequency may be designed to a value between 70 ohm through 130 ohm.

According to one embodiment, if the impedance value formed between the first signal line 491_K and the second signal line 491_K+1, the impedance value formed between the first signal line 491_K and the third signal line 493_K, and the impedance value formed between the second signal line 491_K+1 and the third signal line 493_K are designed substantially the same, deign values such as sizes of elements of a substrate (e.g., 400 of FIG. 4A) and a dielectric constant according to one embodiment of the present invention may be determined by considering various substrate structure as shown in FIGS. 6A through 6C and their impedance value calculation equations. For example, sizes, positions and so on of the first signal line 491_K and the second signal line 491_K+1 may be determined, by considering the substrate structure and the equation suggested in FIG. 6A and or 6B. For example, sizes, positions and so on of the first signal line 491_K and the third signal line 493_K may be determined, by considering the substrate structure and the equation of FIG. 6C. For example, sizes, positions and so on of the second signal line 491_K+1 and the third signal line 493_K may be determined, by considering the substrate structure and the equation of FIG. 6C.

Referring back to FIG. 4B, in one embodiment, a thickness t1 of the first layer 410 may be designed above 53 micrometers (um) and below 65 um. According to one embodiment, a thickness t2 of the second layer 420 may be designed above 53 um and below 65 um. According to one embodiment, a thickness t3 of the third layer 430 may be designed above 18 um and below 22 um. According to one embodiment, a thickness t4 of the fourth layer 440 may be designed above 22 um and below 26 um. According to one embodiment, a thickness t5 of the fifth layer 450 may be designed above 22 um and below 26 um.

According to one embodiment, a gap d3 between the first signal line 491-K and the second signal line 491_K+1 may be designed above 140 um and below 170 um. According to one embodiment, the gap d3 may be designed such that the first signal line 491-K and the second signal line 491_K+1 satisfy 70 ohm or more and 130 ohm or less which is the impedance value corresponding to the designated impedance.

According to one embodiment, widths w11 and w12 of the cross section of the first signal line 491-K and the second signal line 491_K+1 may be designed to be 41 um or above and 49 um or below. Thicknesses t11 and t12 of the cross section of the first signal line 491-K and the second signal line 491_K+1 may be designed to be 17 um or above and 21 um or less. According to one embodiment, a gap t15 between the first signal line 491_K and the fourth layer 440 may be designed to be 36 um or more and 44 um or less. According to one embodiment, a gap t16 between the second signal line 491_K+1 and the fourth layer 440 may be designed to be 36 um or more and 44 um or less.

According to one embodiment, a width w13 of the cross section of the three signal line 493_K may be designed to be 41 um or more and 49 um or less. A thickness t13 of the cross section of the three signal line 493_K may be designed to be 17 um or more and 21 um or less. According to one embodiment, a gap t17 between the third signal line 493_K and the fifth layer 450 may be designed to be 36 um or more and 44 um or less.

According to one embodiment, the gap d1 in the third direction 40031 or the fourth direction 40041 between the first signal line 491_K and the third signal line 493_K, and/or between the second signal line 491_K+1 and the third signal line 493_K may be 51 um or more and 60 um or less.

According to one embodiment, a first dielectric constant of the first dielectric 411 of the first layer 410 may be designed to be 3.4 or more and 4.4 or less. According to one embodiment, a second dielectric constant of the second dielectric 421 of the second layer 420 may be designed to be 3.4 or more and 4.4 or less. According to one embodiment, a third dielectric constant of the third dielectric 431 of the third layer 430 may be designed to be 2.7 or more and 3.7 or less.

According to one embodiment, a thickness t6 of the sixth layer 461 or 462 may be designed to be 17 um or more and 21 um or less. A thickness t7 of the seventh layer 471 or 472 may be designed to be 17 um or more and 21 um or less.

Figure 7:
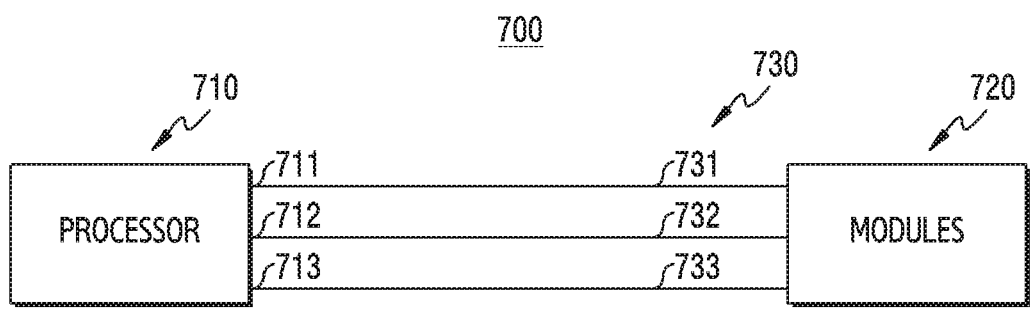
FIG. 7 is a block diagram of an electronic device for processing differential signals transmitted via three signal lines according to one embodiment of the present invention.

FIG. 7 is a block diagram of an electronic device for processing differential signals transmitted via three signal lines according to one embodiment of the present invention. According to various embodiments, an electronic device 700 may include at least part of the electronic device 101 of FIG. 1 or the electronic device 201 of FIG. 2.

Referring to FIG. 7, the electronic device 700 may include a processor 710, one or more modules 720, and a plurality of signal lines 730. According to various embodiments, processor 710 may include the processor 120 of FIG. 1 or the processor 210 of FIG. 2. According to various embodiments, the one or more modules 720 may be various elements (e.g., the input/output interface 150, the display 160, etc.) connected to the processor 120 via a bus (e.g., 110 of FIG. 1). According to various embodiments, the one or more modules 720 may include at least one of the communication module 220, the memory 230, the sensor module 240, the input device 260, the interface 270, the audio module 280, the camera module 291, the power management module 295, and the indicator 297 of FIG. 2.

The plurality of the signal lines 730 may electrically connect the processor 710 and the one or more modules 720. According to one embodiment, one end of the first signal line 731 may be electrically connected to a first terminal 711 of the processor 710, and the other end of the first signal line 731 may be electrically connected to the one or more modules 720. One end of the second signal line 732 may be electrically connected to a second terminal 712 of the processor 710, and the other end of the second signal line 732 may be electrically connected to the one or more modules 720. One end of the third signal line 733 may be electrically connected to a third terminal 713 of the processor 710, and the other end of the third signal line 733 may be electrically connected to the one or more modules 720.

According to various embodiments, the first signal line 731 may include the first signal line 491_K of FIG. 4B. The second signal line 732 may include the second signal line 491_K+1 of FIG. 4B. The third signal line 733 may include the third signal line 493_K of FIG. 4B.

According to one embodiment, the first signal line 431, the second signal line 432 and the third signal line 433 may be paths for transmitting differential signals. The processor 710 may select a transmission/reception mode, and select a plurality of signal lines from the first signal line 731, the second signal line 732 and the third signal line 733 according to the selected transmission/reception mode. According to one embodiment, the processor 710 may obtain attribute information of data to transmit or receive, and select the transmission/reception mode based on the obtained attribute information. For example, the processor 710 may select the transmission/reception mode based on a size of the data to transmit or receive. For example, if the size of data to transmit to the one or more modules 720 or to receive from the one or more modules 720 is smaller than a threshold, the processor 710 may select a first transmission/reception mode, and select two signal lines from the first signal line 731, the second signal line 732 and the third signal line 733 according to the selected first transmission/reception mode. For example, if the size of data to transmit to the one or more modules 720 or to receive from the one or more modules 720 is greater than the threshold, the processor 710 may select a second transmission/reception mode, and select all of the first signal line 731, the second signal line 732 and the third signal line 733 according to the selected second transmission/reception mode. According to various embodiments, the processor 710 may select the transmission/reception mode based on a format of the data to transmit to the one or more modules 720 or to receive from the one or more modules 720.

In the first transmission/reception mode, the processor 710 may transmit differential signals of data to transmit to the one or more modules 720 via the selected two signal lines, or receive from the one or more modules 720. For example, in the first transmission/reception mode, the processor 710 may transmit a first differential signal and a second differential signal of different levels or opposite phases of the data to transmit or receive to the one or more modules 720 via the two selected signal lines, or receive from the one or more modules 720. The processor 710 may compare the first differential signal and the second differential signal received via the two signal lines, and obtain (or extract) data based on a comparison value. In the transmission/reception mode, even if any two signal lines are selected from the three signal lines, since impedance formed by the two selected signal lines is substantially equal to the impedance value of the designated frequency, the signal integrity may be obtained in the differential signal transmission through the two signal lines of the three signal lines.

In the second transmission/reception mode, the processor 710 may transmit differential signals of data to transmit to the one or more modules 720 via all of the first signal line 731, the second signal line 732 and the third signal line 733, or receive from the one or more modules 720. For example, in the second transmission/reception mode, the processor 710 may generate a third differential signal, a fourth differential signal and a fifth differential signal which have different levels or are complementary with respect to the data to transmit or receive, and transmit to the one or more modules 720 via the first signal line 731, the second signal line 732 and the third signal line 733, or receive from the one or more modules 720. The processor 710 may compare the third differential signal, the fourth differential signal and the fifth differential signal received via the first signal line 731, the second signal line 732 and the third signal line 733, and obtain (or extract) data based on a comparison value. According to one embodiment, the third differential signal may be one of a high-level signal, a middle-level signal and a low-level signal. The fourth differential signal may be one of a high-level signal, a middle-level signal and a low-level signal, and may be the signal of a different level from the third differential signal. The fifth differential signal may be one of a high-level signal, a middle-level signal and a low-level signal, and may be the signal of a different level from the third differential signal and the fourth differential signal.

According to one embodiment, a first impedance value (or, simply 'impedance') formed between the first signal line 731 and the second signal line 732, a second impedance value formed between the first signal line 731 and the third signal line 732, and a third impedance value formed between the second signal line 732 and the third signal line 733 may be designed substantially the same as the impedance value corresponding to the designated frequency. If the first impedance value, the second impedance value and the third impedance value are designed substantially the same as the impedance value corresponding to the designated frequency, the signal integrity may be obtained in transmitting the differential signals via all of the three signal lines.

Figure 8:
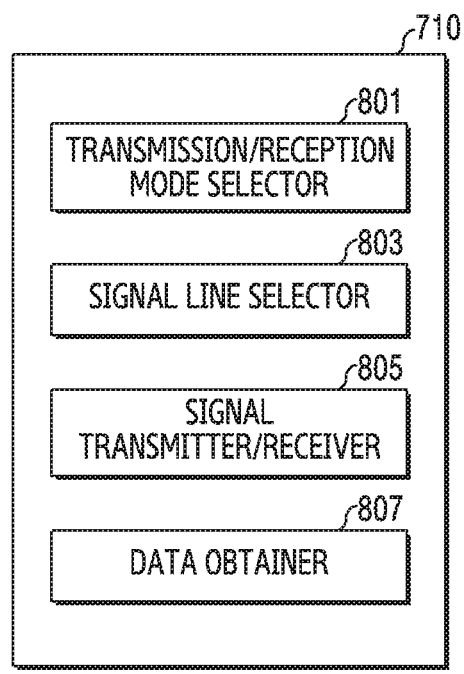
FIG. 8 is a detailed block diagram illustrating a processor of FIG. 6 according to one embodiment of the present invention.

FIG. 8 is a more detailed block diagram of a processor of FIG. 7 according to one embodiment of the present invention.

Referring to FIG. 8, the processor (e.g., 710 of FIG. 7) may include a transmission/reception mode selector 801, a signal line selector 803, a signal transmitter/receiver 805 and a data obtainer 807. According to various embodiments, the transmission/reception mode selector 801, the signal line selector 803, the signal transmitter/receiver 805 and the data obtainer 807 of the processor 710 may execute instructions stored in a memory (e.g., the memory 130 of FIG. 1 or the memory 230 of FIG. 2). According to various embodiments, the instructions may be designed to be embedded in the processor 710.

According to one embodiment, the transmission/reception mode selector 801 may execute an instruction for identifying a size of data to transmit to one or more modules (e.g., 720 of FIG. 7), or to receive from the one or more modules 720. The transmission/reception mode selector 801 may execute an instruction for selecting the transmission/reception mode based on the size of the data to transmit or receive. For example, if the size of the data to transmit or receive is smaller than a threshold, the transmission/reception mode selector 801 may select a first transmission/reception mode. For example, if the size of the data to transmit or receive is greater than the threshold, the transmission/reception mode selector 801 may select a second transmission/reception mode. According to various embodiments, if the data to transmit or receive is image data of a first resolution, the transmission/reception mode selector 801 may select the first transmission/reception mode. If the data to transmit or receive is image data of a second resolution which is higher than the first resolution, the transmission/reception mode selector 801 may select the second transmission/reception mode.

According to various embodiments, if transmitting data to the one more modules (e.g., 720 of FIG. 7) or receiving data from the one or more modules, the transmission/reception mode selector 801 may execute an instruction for selecting the transmission/reception mode based on a format or a type of the data. For example, if the data to transmit or receive is still image data, the transmission/reception mode selector 801 may select the first transmission/reception mode. If the data to transmit or receive is video data, the transmission/reception mode selector 801 may select the second transmission/reception mode.

According to various embodiments, if transmitting data to the one more modules (e.g., 720 of FIG. 7) or receiving data from the one or more modules, the transmission/reception mode selector 801 may execute an instruction for selecting the transmission/reception mode based on an executed application. For example, with a camera application executed or a camera mode activated, the transmission/reception mode selector 801 may select the second transmission/reception mode.

The signal line selector 803 may execute an instruction for selecting a plurality of signal lines from a first signal line (e.g., 731 of FIG. 7), a second signal line (e.g., 732 of FIG. 7) and a third signal line (e.g., 733 of FIG. 7) based on the transmission/reception mode selected by the transmission/reception mode selector 801. According to one embodiment, if the first transmission/reception mode is selected, the signal line selector 803 may select two signal lines from the first signal line 731, the second signal line 732 and the third signal line 733. According to one embodiment, if the second transmission/reception mode is selected, the signal line selector 803 may select all of the first signal line 731, the second signal line 732 and the third signal line 733.

According to one embodiment, the signal line selector 803 may execute an instruction for generating differential signals of data to transmit, and transmitting the generated differential signals to the one or more modules 720 via the plurality of the signal lines selected by the signal line selector 803. According to various embodiments, the signal line selector 803 may execute an instruction for receiving differential signals of data to receive from the one or more modules 720 via the plurality of the signal lines selected by the signal line selector 803.

According to one embodiment, in the first transmission/reception mode, the signal transmitter/receiver 805 may generate a first differential signal (e.g., a first single-ended input signal) and a second differential signal (e.g., a second single-ended input signal) of data to transmit, and transmit the first differential signal and the second differential signal to the one or more modules 720 via the two selected signal lines. According to various embodiments, the signal transmitter/receiver 805 may generate (e.g., encoding) the first differential signal and the second differential signal having opposite phases or different levels (e.g., voltages) with respect to the data to transmit. In the first transmission/reception mode, the signal transmitter/receiver 805 may receive the first differential signal and the second differential signal of data to receive from the one or more modules 720.

According to one embodiment, in the second transmission/reception mode, the signal transmitter/receiver 805 may generate a third differential signal, a fourth differential signal and a fifth differential signal of data to transmit, and transmit to the one or more modules 720 via the first signal line 731, the second signal line 732 and the third signal line 733. In the second transmission/reception mode, the signal transmitter/receiver 805 may receive the third differential signal, the fourth differential signal and the fifth differential signal of the data to receive from the one or more modules 720.

The data obtainer 807 may execute an instruction (e.g., differential signal processing or differential signal calculation) for comparing the differential signals received from the one or more modules 720, and obtaining data based on the comparison result. For example, in the second transmission/reception mode, the data obtainer 807 may obtain receiving end input signals (e.g., 551, 552, and 553 of FIG. 5A) by comparing the third differential signal (e.g., the third single-ended input signal), the fourth differential signal (e.g., the fourth single-ended input signal) and the fifth differential signal (e.g., the fifth single-ended input signal) received from the one or more modules 720, determine a symbol value based on a voltage difference (e.g., $V_{AB\_diff}$, $V_{BC\_diff}$, and $V_{CA\_diff}$ of FIG. 5F) of the obtained receiving end input signals 551, 552, and 553, and obtain the data based on the determined symbol value.

According to one embodiment, the first transmission/reception mode may comply with MIPI D-Phy standard.

According to one embodiment, the second transmission/reception mode may comply with the MIPI C-Phy standard.

According to one embodiment, the first transmission/reception mode or the second transmission/reception mode may comply with a camera serial interface (CSI) or a display serial interface (DSI).

According to one embodiment of the present invention, an electronic device may include a processor including a first terminal, a second terminal and a third terminal, and a substrate. The substrate may include a first layer including a first signal line connected to the first terminal, a second signal line connected to the second terminal and a first dielectric having a first dielectric constant between the first signal line and the second signal line, the first layer disposed to form impedance corresponding to a designated frequency between the first signal line and the second signal line. The substrate may include a dielectric layer disposed under or beneath the first layer, and including at least part of a second dielectric having a second dielectric constant. The substrate may include a second layer disposed under or beneath the dielectric layer. The second layer may include a third signal line disposed in an area facing the first dielectric and connected to the third terminal. The third signal line may be disposed to form impedance having substantially the same magnitude as a magnitude of the impedance corresponding to the designated frequency between the third signal line and the first signal line and between the third signal line and the second signal line.

According to one embodiment of the present invention, the magnitude of the impedance corresponding to the designated frequency may have a value between 70 Ohm and 130 Ohm.

According to one embodiment of the present invention, the second layer may include a dielectric having substantially the same dielectric constant as the first dielectric constant.

According to one embodiment of the present invention, the second dielectric may include a material which bonds the first layer and the second layer, or a material which electrically insulates the first layer and the second layer.

According to one embodiment of the present invention, an interval between the first signal line and the second signal line may be 140 um or more and 170 um or less.

According to one embodiment of the present invention, a thickness of the dielectric layer may be 18 um or more and 22 um or less.

According to one embodiment of the present invention, cross sections of the first signal line and the second signal line may be 41 um or more and 49 um or less in width, and 17 um or more and 21 um or less in thickness.

According to one embodiment of the present invention, the electronic device may further include a first ground attached to at least part of an upper surface of the first layer. A magnitude of impedance between the first signal line and the first ground may have substantially the same magnitude as the impedance corresponding to the designated frequency.

According to one embodiment of the present invention, a thickness of at least part of the first ground may be 22 um or more and 26 um or less.

According to one embodiment of the present invention, a distance between the first signal line and the first ground may be 36 um or more and 44 um or below.

According to one embodiment of the present invention, the electronic device may further include a second ground attached to at least part of a side surface of the first layer. A magnitude of impedance between the first signal line and the second ground may have substantially the same magnitude as the impedance corresponding to the designated frequency.

According to one embodiment of the present invention, the electronic device may further include a third ground attached to at least part of a side surface of the second layer. A magnitude of impedance between the third signal line and the third ground may have substantially the same magnitude as the impedance corresponding to the designated frequency.

According to one embodiment of the present invention, the first signal line, the second signal line and the third signal line may be disposed in a triangular shape.

According to various embodiments of the present invention, an electronic device may include a substrate. The substrate may include a first layer including a first signal line and a second signal line. The first signal line and the second signal line may form impedance corresponding to a designated frequency between the first signal line and the second signal line. The substrate may include a second layer disposed under or beneath the first layer and including a third signal line. The third signal line may be disposed to form impedance having substantially the same magnitude as a magnitude of the impedance corresponding to the designated frequency between the third signal line and the first signal line and between the third signal line and the second signal line. The electronic device may include a processor connected to the first signal line, the second signal line, and the third signal line. The processor may be configured to identify attribute information of data, select at least in part a plurality of signal lines from the first signal line, the second signal line, and the third signal line, based at least on the attribute information, and transmit the data via the at least in part plurality of the signal lines.

According to various embodiments of the present invention, the processor may, based at least on that the attribute information corresponds to a first transmission mode, select two signal lines from the first signal line, the second signal line, and the third signal line, and transmit a first signal and a second signal via the two selected signal lines. The processor may be configured to, based on that the attribute information corresponds to a second transmission mode, transmit a third signal, a fourth signal, and a fifth signal via the first signal line, the second signal line, and the third signal line.

According to various embodiments of the present invention, the processor may be configured to, based on that the attribute information corresponds to the first transmission mode, select the first signal line and the third signal line as the two signal lines.

According to various embodiments of the present invention, the attribute information of the data may include a size of the data.

According to various embodiments of the present invention, the electronic device may further include a ground attached to at least part of an upper surface of the first layer. A magnitude of impedance between the first signal line and the ground or a magnitude of impedance between the second signal line and the ground may have substantially the same magnitude as the impedance corresponding to the designated frequency.

According to various embodiments of the present invention, a circuit board may include a first layer. The first layer may include a first signal line and a second signal line. The first signal line and the second signal line may be disposed to form impedance corresponding to a designated frequency between the first signal line and the second signal line. The circuit board may include a second layer disposed under or beneath the first layer. The second layer may include a third signal line. The third signal line may be disposed to form impedance having substantially the same magnitude as the magnitude of the impedance corresponding to the designated frequency between the third signal line and the first signal line and between the third signal line and second first signal line.

According to various embodiments of the present invention, the circuit board may be an FPCB.

According to various embodiments of the present invention, the first signal line and the second signal line may be formed at an interval such that the impedance corresponding to the designated frequency satisfies 70 Ohm or more and 130 Ohm or less in at least a partial section.

Figure 9:
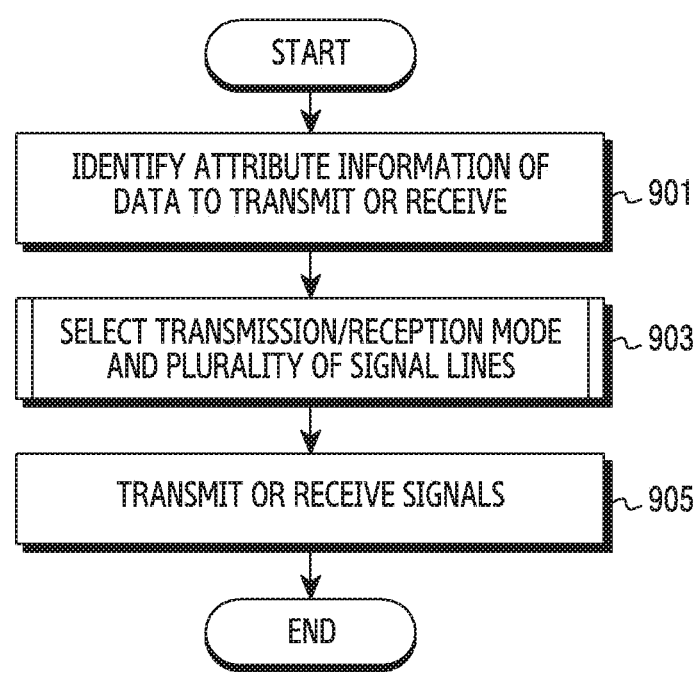
FIG. 9 illustrates a data transmitting/receiving operation flow between a processor and one or more modules in an electronic device according to one embodiment of the present invention.

FIG. 9 illustrates a data transmission/reception operation flow between a processor and one or more modules in an electronic device according to one embodiment of the present invention. According to various embodiments, the electronic device may include components of part or whole of the electronic device 101 of FIG. 1 or the electronic device 201 of FIG. 2.

Referring to FIG. 9, in operation 901, the processor (e.g., 710 of FIG. 7) may identify attribute information of data to transmit to the one or more modules (e.g., 720 of FIG. 7) or data to receive from the one or more modules 720. The attribute information of the data may include a data size, a data format, a data type, and so on.

In operation 903, the processor 710 may select a transmission/reception mode based on the attribute information of the data to transmit or receive. In operation 903, the processor 710 may select a plurality of signal lines from a first signal line (e.g., 731 of FIG. 7), a second signal line (e.g., 732 of FIG. 7) and a third signal line (e.g., 733 of FIG. 7) based on the selected transmission/reception mode. According to one embodiment, if the first transmission/reception mode is selected, the processor 710 may select two signal lines from the first signal line 731, the second signal line 732 and the third signal line 733. According to one embodiment, if the second transmission/reception mode is selected, the processor 710 may select all of the first signal line 731, the second signal line 732 and the third signal line 733.

In operation 905, the processor 710 may generate differential signals of the data to transmit, according to the selected transmission/reception mode, and transmit the generated differential signals to the one or more modules 720 via the plurality of the selected signal lines. According to one embodiment, in the first transmission/reception mode, the processor 710 may generate a first differential signal (e.g., a first single-ended input signal) and a second differential signal (e.g., a second single-ended input signal) of the data to transmit, and transmit the first differential signal and the second differential signal to the one or more modules 720 via the two selected signal lines. According to one embodiment, in the second transmission/reception mode, the processor 710 may generate (e.g., encoding) a third differential signal, a fourth differential signal and a fifth differential signal of the data to transmit, and transmit the third differential signal, the fourth differential signal and the fifth differential signal to the one or more modules 720 via the three selected signal lines.

In operation 905, according to the selected transmission/reception mode, the processor 710 may receive signals of data to receive from the one or more modules 720 via the plurality of the selected signal lines. According to one embodiment, in the first transmission/reception mode, the processor 710 may receive differential signals (e.g., single-ended input signals) of the data to receive from the one or more modules 720 via the two selected signal lines. According to one embodiment, in the second transmission/reception mode, the processor 710 may receive differential signals (e.g., single-ended input signals) of the data to receive from the one or more modules 720 via the three selected signal lines.

According to one embodiment, a first impedance value formed between the first signal line 731 and the second signal line 732, a second impedance value formed between the first signal line 731 and the third signal line 733, and a third impedance value formed between the second signal line 732 and the third signal line 733 may be designed substantially the same. Since the first impedance value, the second impedance value and the third impedance value are designed substantially the same, the signal integrity may be acquired in exchanging data via the plurality of the signal lines, in the first transmission/reception mode or the second transmission/reception mode.

Figure 10:
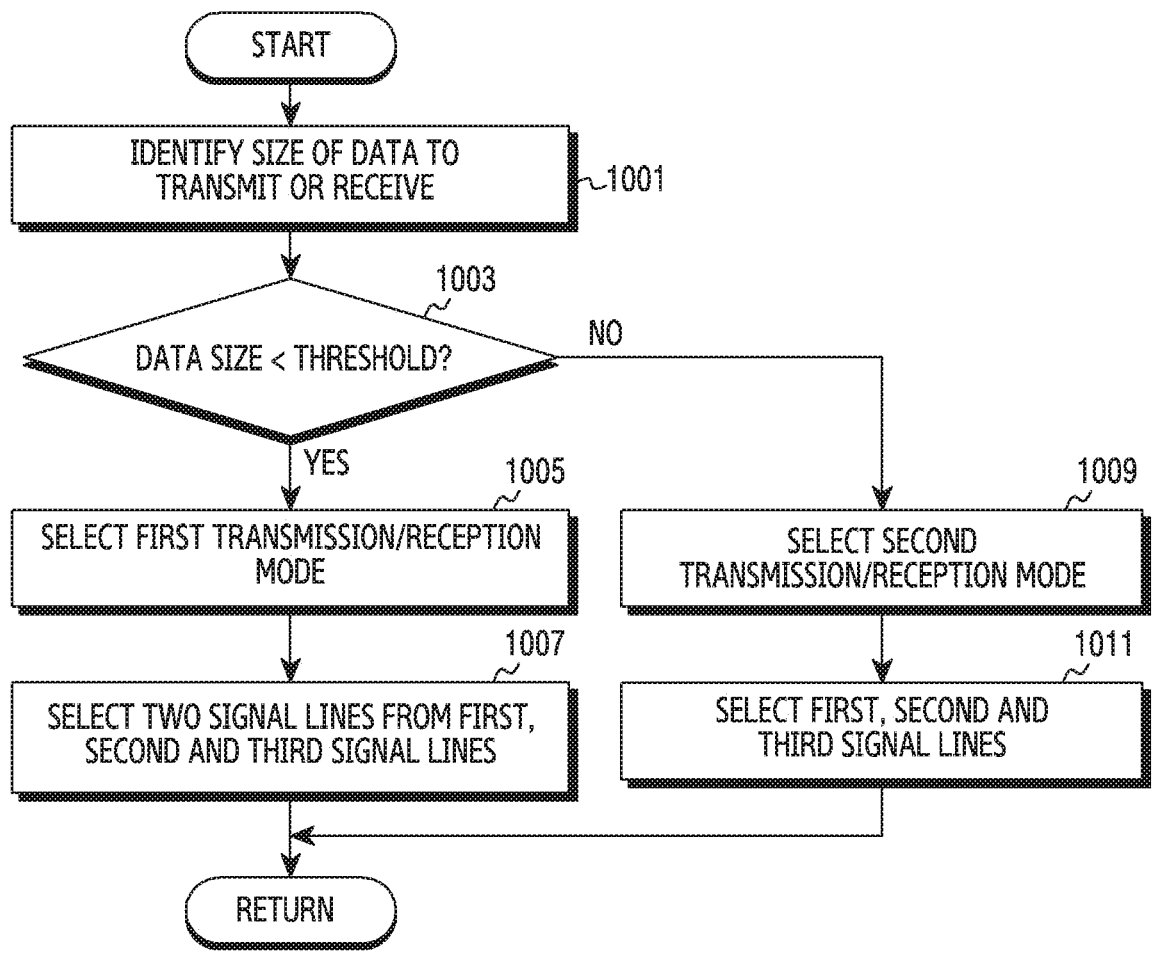
FIG. 10 is an operation flow for selecting a plurality of signal lines from first, second and third signal lines of operation 903 of FIG. 9 according to one embodiment of the present invention.
Figure 11A:
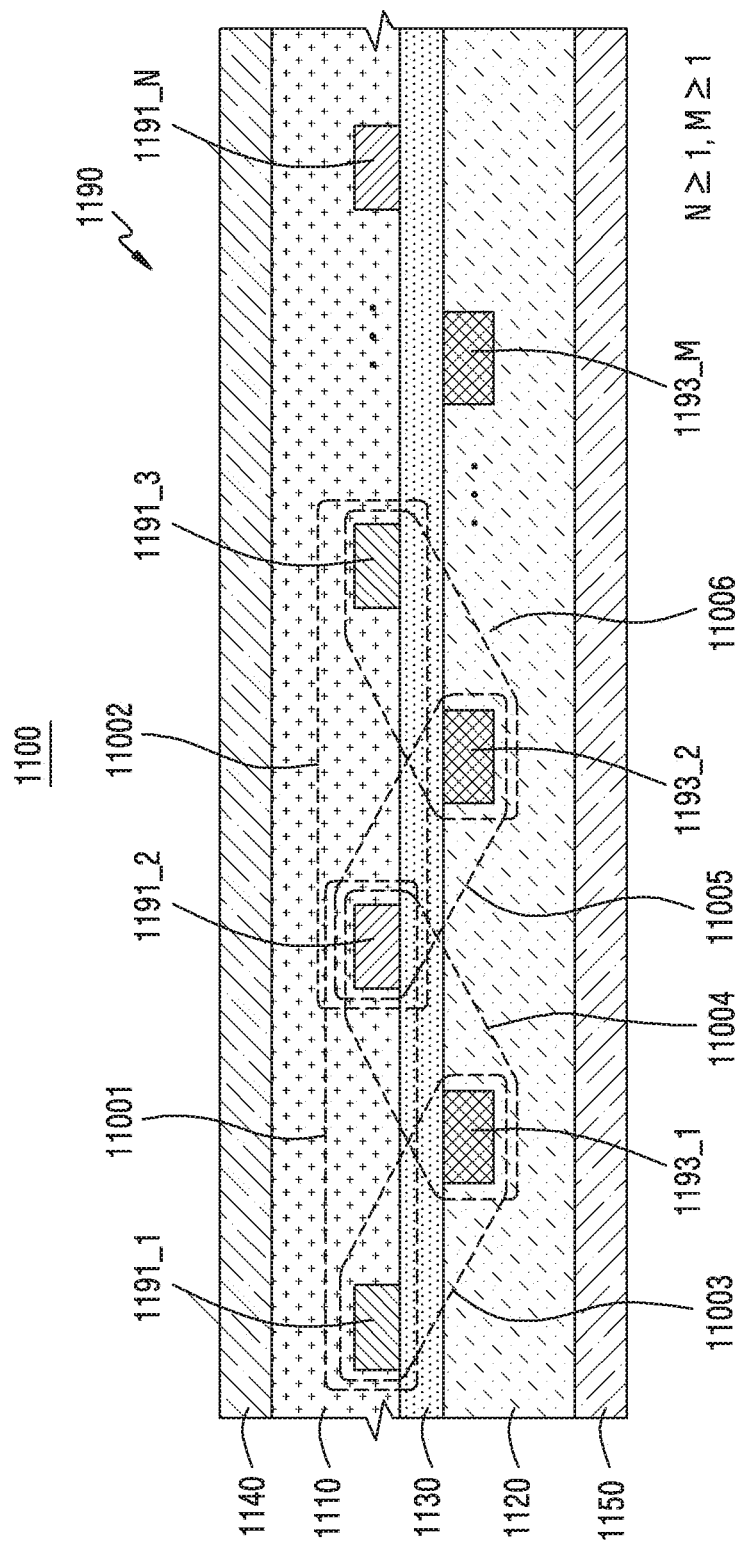
FIGS. 11A and 11B are cross-sectional views showing a substrate structure of an electronic device for explaining an operation flow of FIG. 10 according to various embodiments of the present invention.
Figure 11B:
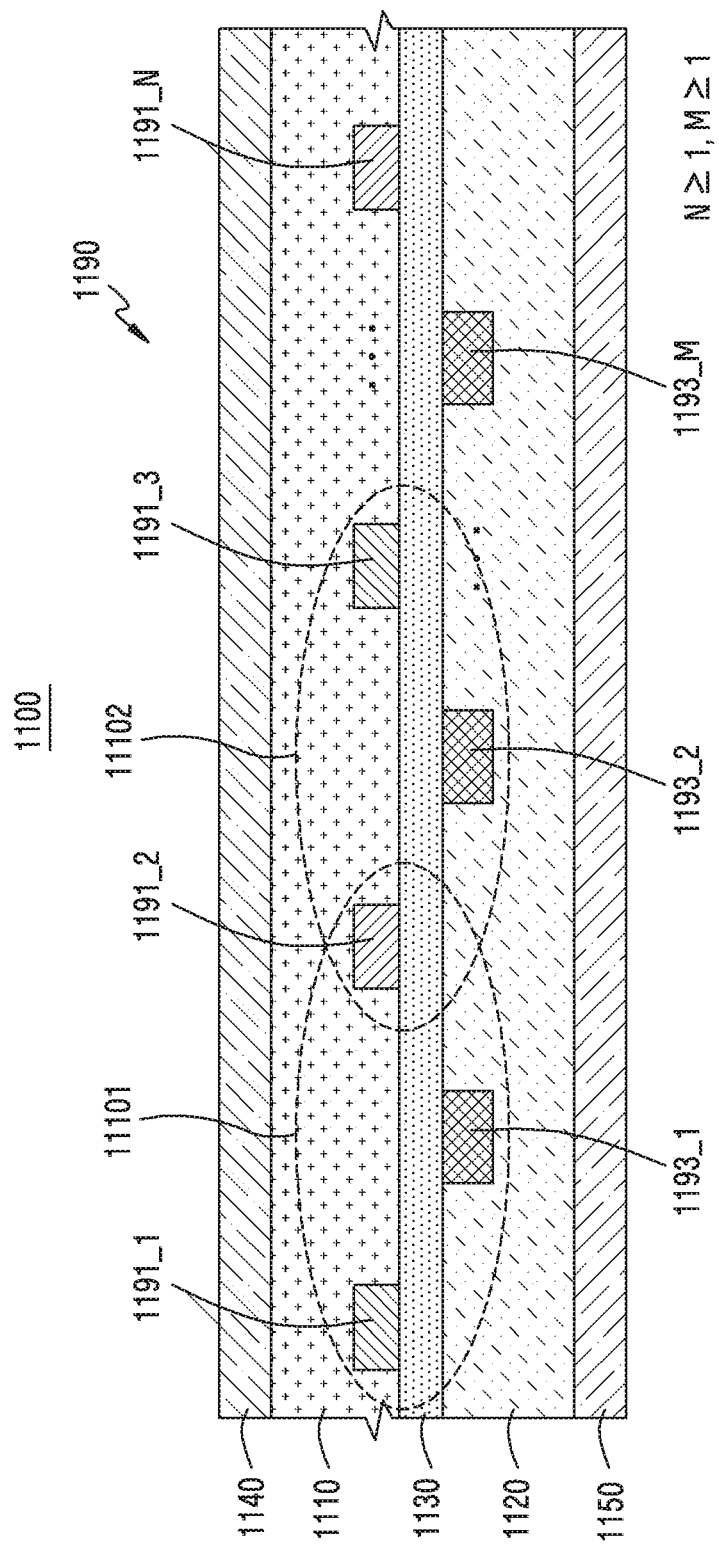

FIG. 10 is an operation flow for selecting a plurality of signal lines from first, second and third signal lines of operation 903 of FIG. 9 according to one embodiment of the present invention. FIGS. 11A and 11B are cross-sectional views showing a substrate structure of an electronic device for explaining an operation flow of FIG. 10 according to various embodiments of the present invention.

Referring to FIGS. 11A and 11B, in various embodiments, a substrate 1100 may be at least in part similar or equal to the substrate 400 of FIG. 4A. For example, the substrate 1100 may be designed to dispose a plurality of signal lines 1190 and a plurality of elements coupled thereto. The substrate 1100 may include a first layer 1110, a second layer 1120, a third layer 1130, a fourth layer 1140 or a fifth layer 1150 which is similar to equal to the first layer 410, the second layer 420, the third layer 430, the fourth layer 440 or the fifth layer 450 of FIG. 4A respectively. The plurality of the signal lines 1190 may include a plurality of upper signal lines 1191_N which are similar or equal to the plurality of the upper signal lines 491_N of FIG. 4A. The plurality of the signal lines 1190 may include a plurality of lower signal lines 1193_M which are similar or equal to the plurality of the lower signal lines 493_M of FIG. 4A. According to one embodiment, a group including two signal lines or three signal lines of the plurality of the signal lines 1190 may be used in the signal transmission using the differential signal processing.

Referring to FIG. 10, in operation 1001, a processor (e.g., 710 of FIG. 7) may identify a size of data to transmit to at least one module (e.g., 720 of FIG. 7). In operation 1001, the processor 710 may identify a size of data to receive from the at least one module 720.

In operation 1003, the processor 710 may determine whether the size of the data to transmit or receive is smaller than a threshold.

If the size of the data to transmit or receive is smaller than the threshold, the processor 710 may perform operation 1005. In operation 1005, the processor 710 may select the first transmission/reception mode from the first transmission/reception mode and the second transmission/reception mode.

In operation 1007, the processor 710 may select two signal lines from a first signal line (e.g., 731 of FIG. 7), a second signal line (e.g., 732 of FIG. 7) and a third signal line (e.g., 733 of FIG. 7) based on the selected first transmission/reception mode. Referring to FIG. 11A, in one embodiment, the processor 710 may select two signal lines from the plurality of the signal lines 1190 according to the first transmission/reception mode. For example, the processor 710 may select at least one group (e.g., 11001 or 11002) (hereafter, 'a first type group') including two neighboring signal lines of the plurality of the upper signal lines 1190_N. For example, the processor 710 may select at least one group (e.g., 11003, 11004, 11005, or 11006) ('a second type group') including one of the upper signal lines 1191-N and its neighboring one of the lower signal lines 1193_M. Since an impedance value formed between the two signal lines of the first type group is designed substantially the same as an impedance value formed between the two signal lines of the second type group, the signal integrity may be acquired even though signals are transmitted using any one of the first type group and the second type group in the first transmission/reception mode.

If the size of the data to transmit or receive is greater than the threshold, the processor 710 may perform operation 1009. In operation 1009, the processor 710 may select the first transmission/reception mode from the first transmission/reception mode and the second transmission/reception mode. According to one embodiment, the second transmission/reception mode may be a mode for transmitting data relatively faster than the first transmission/reception mode.

In operation 1011, the processor 710 may select all of the first signal line (e.g., 731 of FIG. 7), the second signal line (e.g., 732 of FIG. 7) and the third signal line (e.g., 733 of FIG. 7) based on the selected second transmission/reception mode. Referring to FIG. 11B, in one embodiment, the processor 710 may select three signal lines from the plurality of the signal lines 1190 according to the second transmission/reception mode. For example, the processor 710 may select at least one group (e.g., 11101 or 11102) (hereafter, 'a third type group') including three signal lines of a triangle arrangement shape including two upper signal lines and one lower signal line of the plurality of the signal lines 1190. Since the impedance value formed between the first signal line and the second signal line, the impedance value formed between the first signal line and the third signal line, and the impedance value formed between the second signal line and the third signal line among the three signal lines (e.g., the first signal line, the second signal line and the third signal line) of the third type group are designed substantially the same, the signal integrity may be acquired if signals are exchanged through the third type group in the second transmission/reception mode. According to various embodiments, the second transmission/reception mode may use the operation flow of the signal transmission using the differential signal processing explained by referring to FIGS. 5A, 5B, 5C, 5D, 5E and 5F.

According to various embodiments, the processor 710 may select a plurality of signal lines from the first signal line 731, the second signal line 732 and the third signal line 733 according to other various operation flows which are not shown.

According to various embodiments, the processor 710 may select the transmission/reception mode based on the format of the data to transmit or receive. For example, if image data of a still image format is transmitted by a camera module (e.g., 291 of FIG. 2) to the processor 710, the processor 710 may select the first transmission/reception mode. If image data of a video image format is transmitted by the camera module 291 to the processor 710, the processor 710 may select the second transmission/reception mode.

According to various embodiments, the processor 710 may select the transmission/reception mode based on execution of a specific application in association with the data to transmit or receive. For example, if a camera application is executed and image data acquired by a camera module (e.g., 291 of FIG. 2) is transmitted to the processor 710, the processor 710 may select the second transmission/reception mode based on the camera application execution.

According to various embodiments, the processor 710 may select the transmission/reception mode based on a resolution of image data to transmit or receive. For example, if the data to transmit or receive is image data of a first resolution, the processor 710 may select the first transmission/reception mode. If the data to transmit or receive is image data of the second resolution which higher than the first resolution, the processor 710 may select the second transmission/reception mode.

Meanwhile, the aforementioned embodiments of the present invention may be written as a program executable at a computer, and may be implemented at a general purpose digital computer which operates the program using a computer readable recording medium. In addition, a structure of data used in the aforementioned embodiments of the present invention may be recorded in the computer readable recording medium through various means. The computer readable recording medium includes a storage medium such as a magnetic storage medium (e.g., ROM, floppy disk, hard disk, etc.), and an optical recording medium (e.g., CD-ROM, DVD, etc.).

So far, preferred embodiments of the present invention have been described. One skilled in the art of the technical field which the present invention belongs to will appreciate that the present invention may be implemented in a modified form without departing from the essential characteristics of the present invention. Therefore, the disclosed embodiments should be considered in a descriptive sense and not for purposes of limitation. The scope of the present invention is disclosed in the claims, not in the above-stated descriptions, and all differences within the equivalent scope should be construed as being included in the present invention.

The invention claimed is:
1. An electronic device comprising:
a processor comprising a first terminal, a second terminal, and a third terminal; and
a substrate, the substrate comprising:
a first layer comprising a first signal line connected to the first terminal, a second signal line connected to the second terminal, and a first dielectric having a first dielectric constant between the first signal line and the second signal line, the first layer disposed to form an impedance corresponding to a designated frequency between the first signal line and the second signal line;
a dielectric layer disposed under or beneath the first layer, and comprising at least part of a second dielectric having a second dielectric constant, and
a second layer disposed under or beneath the dielectric layer, the second layer comprising a third signal line disposed in an area facing the first dielectric and connected to the third terminal, the third signal line disposed to form an impedance having substantially a same magnitude as a magnitude of the impedance corresponding to the designated frequency between the third signal line and the first signal line and between the third signal line and the second signal line,
wherein the three signal lines are disposed substantially in a triangular shape.
2. The electronic device of claim 1, wherein the magnitude of the impedance corresponding to the designated frequency has a value between 70 Ohms and 130 Ohms.
3. The electronic device of claim 1, wherein the second layer comprises a dielectric having substantially a same dielectric constant as the first dielectric constant.
4. The electronic device of claim 1, wherein the second dielectric comprises a material which bonds the first layer and the second layer, or a material which electrically insulates the first layer and the second layer.
5. The electronic device of claim 1, wherein an interval between the first signal line and the second signal line is 140 um or more and 170 um or less.
6. The electronic device of claim 1, wherein a thickness of the dielectric layer is 18 um or more and 22 um or less.

7. The electronic device of claim 1, wherein cross sections of the first signal line and the second signal line are 41 um or more and 49 um or less in width, and are 17 um or more and 21 um or less in thickness.
8. The electronic device of claim 1, further comprising:
a first ground attached to at least part of an upper surface of the first layer,
wherein a magnitude of an impedance between the first signal line and the first ground has substantially the same magnitude as the impedance corresponding to the designated frequency.
9. The electronic device of claim 8, wherein a thickness of at least part of the first ground is 22 um or more and 26 um or less.
10. The electronic device of claim 8, wherein a distance between the first signal line and the first ground is 36 um or more and 44 um or below.
11. The electronic device of claim 1, further comprising:
a second ground attached to at least part of a side surface of the first layer,
wherein a magnitude of an impedance between the first signal line and the second ground has substantially the same magnitude as the impedance corresponding to the designated frequency.
12. The electronic device of claim 1, further comprising:
a third ground attached to at least part of a side surface of the second layer,
wherein a magnitude of an impedance between the third signal line and the third ground has substantially the same magnitude as the impedance corresponding to the designated frequency.
13. An electronic device comprising:
a substrate, the substrate comprising:
a first layer comprising a first signal line and a second signal line, the first signal line and the second signal line forming an impedance corresponding to a designated frequency between the first signal line and the second signal, and
a second layer disposed under or beneath the first layer and comprising a third signal line, the third signal line disposed to form an impedance having substantially a same magnitude as a magnitude of the impedance corresponding to the designated frequency between the third signal line and the first signal line and between the third signal line and the second signal line; and
a processor connected to the first signal line, the second signal line, and the third signal line, the processor configured to:
identify attribute information of data,
select two or three signal lines from the first signal line, the second signal line, and the third signal line, based at least on the attribute information, and
transmit the data via the selected two or three signal lines.
14. The electronic device of claim 13, wherein the processor is further configured to:
based at least on the attribute information corresponding to a first transmission mode, select two signal lines from the first signal line, the second signal line, and the third signal line, and transmit a first signal and a second signal via the two selected signal lines, and
based on the attribute information corresponding to a second transmission mode, transmit a third signal, a fourth signal, and a fifth signal via the first signal line, the second signal line, and the third signal line.

15. The electronic device of claim 14, wherein the processor is configured to:
based on that the attribute information corresponds to the first transmission mode, select the first signal line and the third signal line as the two selected signal lines.

16. The electronic device of claim 13, wherein the attribute information of the data comprises a size of the data.

17. The electronic device of claim 13, further comprising:
a ground attached to at least part of an upper surface of the first layer,
wherein a magnitude of an impedance between the first signal line and the ground or a magnitude of an impedance between the second signal line and the ground has substantially the same magnitude as the impedance corresponding to the designated frequency.

18. A substrate comprising:
a first layer comprising a first signal line and a second signal line, wherein the first layer is disposed to form impedance corresponding to a designated frequency between the first signal line and the second signal line; and
a second layer disposed under or beneath the first layer, wherein the second layer comprises a third signal line disposed to form an impedance having substantially a same magnitude as a magnitude of the impedance corresponding to the designated frequency between the third signal line and the first signal line and between the third signal line and the second signal line,
wherein the three signal lines are disposed substantially in a triangular shape.

19. The substrate of claim 18, wherein the substrate is flexible printed circuit board.

20. The substrate of claim 18, wherein the magnitude of the impedance corresponding to the designated frequency has a value between 70 Ohms and 130 Ohms.

* * * * *